US012696805B2

(12) United States Patent
Nam

(10) Patent No.: US 12,696,805 B2
(45) Date of Patent: Jul. 28, 2026

(54) DISPLAY DEVICE

(71) Applicant: Samsung Display Co., LTD., Yongin-si (KR)

(72) Inventor: Yuk Hyun Nam, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 743 days.

(21) Appl. No.: 17/975,848

(22) Filed: Oct. 28, 2022

(65) Prior Publication Data

US 2023/0253385 A1 Aug. 10, 2023

(30) Foreign Application Priority Data

Feb. 7, 2022 (KR) ........................ 10-2022-0015299

(51) Int. Cl.
 H10W 90/00 (2026.01)
 H10H 20/85 (2025.01)
(52) U.S. Cl.
 CPC ........ H10W 90/00 (2026.01); H10H 20/8506 (2025.01)
(58) Field of Classification Search
 CPC .............. H01L 25/167; H01L 25/0753; H10H 20/8506; H10H 20/857; H10H 29/142; G02F 1/1675; G02F 1/1676; G02F 1/1679; H10D 86/411; H10D 86/481; H10D 86/60; H10K 59/122; H10K 50/805; H10K 59/35
See application file for complete search history.

(56) References Cited

U.S. PATENT DOCUMENTS

| | | | |
|---|---|---|---|
| 11,600,756 B2 | 3/2023 | Kim et al. | |
| 11,824,138 B2 | 11/2023 | Beak et al. | |
| 12,166,022 B2 | 12/2024 | Li et al. | |

(Continued)

FOREIGN PATENT DOCUMENTS

| | | | |
|---|---|---|---|
| KR | 10-2020-0049394 A | 5/2020 | |
| KR | 10-2020-0070493 A | 6/2020 | |

(Continued)

OTHER PUBLICATIONS

Korean Notice of Allowance issued in corresponding KR Application No. 10-2022-0015299, dated Apr. 28, 2026, 4 pages.

*Primary Examiner* — Eliseo Ramos Feliciano
*Assistant Examiner* — Thaddeus J Kolb
(74) *Attorney, Agent, or Firm* — Womble Bond Dickinson (US) LLP

(57) ABSTRACT

A display device includes a substrate, a via layer disposed on the substrate, first bank pattern layers, a second bank pattern layer and third bank pattern layers, which are disposed on the via layer, a first electrode and a second electrode spaced apart from each other, a light emitting element disposed between the first electrode and the second electrode, and a bank layer disposed on the first bank pattern layers and the third bank pattern layers and defining an emission area. The third bank pattern layers extend in a first direction and spaced apart from each other, the first bank pattern layers and the second bank pattern extend from the third bank pattern layers in a second direction intersecting the first direction, and a thickness of the first bank pattern layers is smaller than a thickness of the third bank pattern layers.

20 Claims, 15 Drawing Sheets

(56)                  References Cited

U.S. PATENT DOCUMENTS

| | | | |
|---|---|---|---|
| 12,308,357 B2 | 5/2025 | Lee et al. | |
| 12,349,526 B2 | 7/2025 | Kim et al. | |
| 12,433,079 B2 | 9/2025 | Yun et al. | |
| 2020/0043976 A1* | 2/2020 | Kim | H10H 20/856 |
| 2020/0135971 A1 | 4/2020 | Beak et al. | |
| 2021/0057623 A1 | 2/2021 | Kim et al. | |
| 2021/0335765 A1 | 10/2021 | Lee et al. | |
| 2022/0013511 A1* | 1/2022 | Kishimoto | H10H 29/142 |
| 2022/0037302 A1* | 2/2022 | Kim | G09G 3/32 |
| 2022/0037394 A1* | 2/2022 | Jeong | H10H 29/142 |
| 2022/0052032 A1 | 2/2022 | Li et al. | |
| 2023/0187584 A1 | 6/2023 | Kim et al. | |
| 2023/0207608 A1 | 6/2023 | Kim et al. | |
| 2023/0207770 A1 | 6/2023 | Kim et al. | |
| 2023/0209907 A1* | 6/2023 | Jung | H10K 59/122 |
| | | | 257/79 |
| 2023/0361259 A1 | 11/2023 | Yun et al. | |
| 2024/0055556 A1* | 2/2024 | Beak | H10H 29/142 |
| 2025/0259980 A1 | 8/2025 | Lee et al. | |

FOREIGN PATENT DOCUMENTS

| | | |
|---|---|---|
| KR | 10-2021-0024347 A | 3/2021 |
| KR | 10-2021-0095774 A | 8/2021 |
| KR | 10-2021-0098313 | 8/2021 |
| KR | 10-2021-0124564 | 10/2021 |
| KR | 10-2021-0132271 A | 11/2021 |
| KR | 10-2021-0135383 A | 11/2021 |
| KR | 10-2021-0141801 A | 11/2021 |
| KR | 10-2021-0146767 A | 12/2021 |

* cited by examiner

RME: RME1, RME2, RME3
CNE: CNE1, CNE2, CNE3

ED: ED1, ED2
RME: RME1, RME2, RME3
CNE: CNE1, CNE2, CNE3

RME: RME1, RME2, RME3
CNE: CNE1, CNE2, CNE3

RME: RME1, RME2, RME3
CNE: CNE1, CNE2, CNE3

DISPLAY DEVICE

CROSS-REFERENCE TO RELATED APPLICATION(S)

This application claims priority to and benefits of Korean Patent Application No. 10-2022-0015299 under 35 U.S.C. § 119, filed on Feb. 7, 2022, in the Korean Intellectual Property Office (KIPO), the entire contents of which are incorporated herein by reference.

BACKGROUND

1. Technical Field

Embodiments relate to a display device including bank pattern layers.

2. Description of the Related Art

With the advancement of multimedia, importance of a display device has been increased. Thus, various types of display devices such as an organic light emitting display (OLED) device and a liquid crystal display (LCD) device have been used or developed.

The display device is a device for displaying an image, and includes a display panel such as an organic light emitting display panel or a liquid crystal display panel. The light emitting display panel may include a light emitting element (e.g., a light emitting diode (LED)) including an organic light emitting diode (OLED) formed of an organic light emitting material and an inorganic light emitting diode formed of an inorganic light emitting material.

SUMMARY

Embodiments provide a display device capable of preventing ink including a light emitting element from overflowing over light emitting areas by bank pattern layers.

However, embodiments of the disclosure are not limited to those set forth herein. The above and other embodiments will become more apparent to one of ordinary skill in the art to which the disclosure pertains by referencing the detailed description of the disclosure given below.

According to an embodiment, a display device may include a substrate including a plurality of subpixels, a via layer disposed on the substrate, first bank pattern layers, a second bank pattern layer and third bank pattern layers disposed on the via layer, a first electrode disposed on the second bank pattern layer and a second electrode disposed on the first bank pattern layers, the first electrode and the second electrode spaced apart from each other, a light emitting element disposed between the first electrode and the second electrode, and a bank layer disposed on the first bank pattern layers and the third bank pattern layers, the bank layer defining an emission area, wherein the third bank pattern layers may extend in a first direction and spaced apart from each other, the first bank pattern layers and the second bank pattern layer may extend from the third bank pattern layers in a second direction intersecting the first direction, and a thickness of the first bank pattern layers may be smaller than a thickness of the third bank pattern layers.

In an embodiment, a height of an upper surface of the bank layer overlapping the third bank pattern layers may be greater than a height of an upper surface of the bank layer overlapping the first bank pattern layers.

In an embodiment, a width of the third bank pattern layers may be greater than a width of the bank layer overlapping the third bank pattern layers.

In an embodiment, a width of the first bank pattern layers may be greater than a width of the bank layer overlapping the first bank pattern layers.

In an embodiment, the first bank pattern layers, the second bank pattern layer and the third bank pattern layers may be continuously connected to each other.

In an embodiment, the second bank pattern layer may overlap the emission area, and may be disposed between the first bank pattern layers spaced apart from each other in the first direction.

In an embodiment, the bank layer may define a sub-area spaced apart from the emission area in the second direction, and the third bank pattern layers may be disposed between the emission area and the sub-area.

In an embodiment, the first bank pattern layers and the third bank pattern layers may overlap the bank layer, and the second bank pattern layer may not overlap the bank layer.

In an embodiment, the display device may further include a first connection electrode that is in contact with an end portion of the light emitting element, and a second connection electrode that is in contact with the other end portion of the light emitting element, wherein the first connection electrode overlaps the third bank pattern layers and may extend to cross over the third bank pattern layers.

According to an embodiment, a display device may include a substrate including a plurality of pixels, each of the plurality of pixels including a plurality of subpixels, a via layer disposed on the substrate, first bank pattern layers, a second bank pattern layer and third bank pattern layers disposed on the via layer, a first electrode disposed on the second bank pattern layer and a second electrode disposed on the first bank pattern layers, the first electrode and the second electrode spaced apart from each other, a light emitting element disposed between the first electrode and the second electrode, and a bank layer disposed on the first bank pattern layers and the third bank pattern layers, the bank layer defining an emission area, wherein the third bank pattern layers may extend in a first direction and spaced apart from each other, the first bank pattern layers and the second bank pattern layer may extend from the third bank pattern layers in a second direction intersecting the first direction, and a thickness of the first bank pattern layers disposed between the pixels adjacent to each other may be greater than a thickness of the first bank pattern layers disposed between the subpixels adjacent to each other in each of the pixels.

In an embodiment, the plurality of pixels may include a first pixel, a second pixel, and a third pixel, the first pixel disposed between the second pixel and the third pixel, each of the first pixel, the second pixel, and the third pixel may include a first subpixel, a second subpixel adjacent to the first subpixel, and a third subpixel adjacent to the second subpixel, and a thickness of the first bank pattern layer disposed between the first subpixel of the first pixel and the third subpixel of the second pixel, which is adjacent to the first subpixel of the first pixel, may be greater than a thickness of the first bank pattern layer disposed between the first subpixel of the first pixel and the second subpixel of the first pixel.

In an embodiment, a thickness of the first bank pattern layer disposed between the third subpixel of the first pixel and the first subpixel of the third pixel, which is adjacent to the third subpixel of the first pixel may be greater than a thickness of the first bank pattern layer disposed between the second subpixel of the first pixel and the third subpixel of the first pixel.

In an embodiment, a height of an upper surface of the bank layer disposed between the pixels adjacent to each other may be greater than a height of an upper surface of the bank layer disposed between the subpixels adjacent to each other in each of the pixels.

In an embodiment, a thickness of the third bank pattern layer may be substantially equal to a thickness of the first bank pattern layers disposed between the pixels adjacent to each other.

In an embodiment, a thickness of the second bank pattern layer may be substantially equal to a thickness of the first bank pattern layers disposed between the subpixels adjacent to each other.

According to an embodiment, a display device may include a substrate including a plurality of pixels, each of the plurality of pixel including a plurality of subpixels, a via layer disposed on the substrate, first bank pattern layers and a second bank pattern layer, which are disposed on the via layer and spaced apart from each other, a first electrode disposed on the second bank pattern layer and a second electrode disposed on the first bank pattern layers, the first electrode and the second electrode spaced apart from each other, a light emitting element disposed between the first electrode and the second electrode, and a bank layer disposed on the first bank pattern layers, the bank layer defining an emission area, wherein the second bank pattern layer may overlap the emission area, and may be disposed between the first bank pattern layers spaced apart from each other, and a thickness of the first bank pattern layers disposed between the pixels adjacent to each other may be greater than a thickness of the first bank pattern layers disposed between the subpixels adjacent to each other in each of the plurality of pixels.

In an embodiment, the bank layer includes a first portion extending in a first direction and a second portion extending in a second direction intersecting the first direction, and the first bank pattern layers and the second bank pattern layer may extend in the second direction and spaced apart from each other in the first direction.

In an embodiment, the plurality of pixels include a first pixel, a second pixel, and a third pixel, the first pixel disposed between the second pixel and the third pixel, each of the first pixel, the second pixel, and the third pixel may include a first subpixel, a second subpixel adjacent to the first subpixel, and a third subpixel adjacent to the second subpixel, and a thickness of the first bank pattern layer disposed between the first subpixel of the first pixel and the third subpixel of the second pixel, which is adjacent to the first subpixel of the first pixel, may be greater than a thickness of the first bank pattern layer disposed between the first subpixel of the first pixel and the second subpixel of the first pixel.

In an embodiment, a thickness of the first bank pattern layer disposed between the third subpixel of the first pixel and the first subpixel of the second pixel, which is adjacent to the third subpixel of the first pixel, may be greater than a thickness of the first bank pattern layer disposed between the second subpixel of the first pixel and the third subpixel of the first pixel.

In an embodiment, a height of an upper surface of the bank layer disposed between the pixels adjacent to each other may be greater than a height of an upper surface of the bank layer disposed between the subpixels adjacent to each other in each of the pixels.

In the display device according to embodiments, a width of a third bank pattern layer may be greater than a width of a bank layer to form a step difference between the third bank pattern layer and the bank layer, whereby preventing electrodes from being short-circuited on the bank layer.

Also, a thickness of a first bank pattern layer disposed between adjacent subpixels may be formed to be smaller than a thickness of the third bank pattern layer, whereby a thickness of ink applied to each subpixel may be uniform.

The effects according to the embodiments are not limited to those mentioned above and more various effects are included in the following description of the disclosure.

BRIEF DESCRIPTION OF THE DRAWINGS

The above and other aspects and features of the disclosure will become more apparent by describing in detail embodiments thereof with reference to the attached drawings, in which:

FIG. 6 is a schematic cross-sectional view taken along line Q2-Q2' of FIG. 4;

FIG. 7 is a schematic cross-sectional view taken along line Q3-Q3' of FIG. 4;

DETAILED DESCRIPTION OF THE EMBODIMENTS

Figure 1:
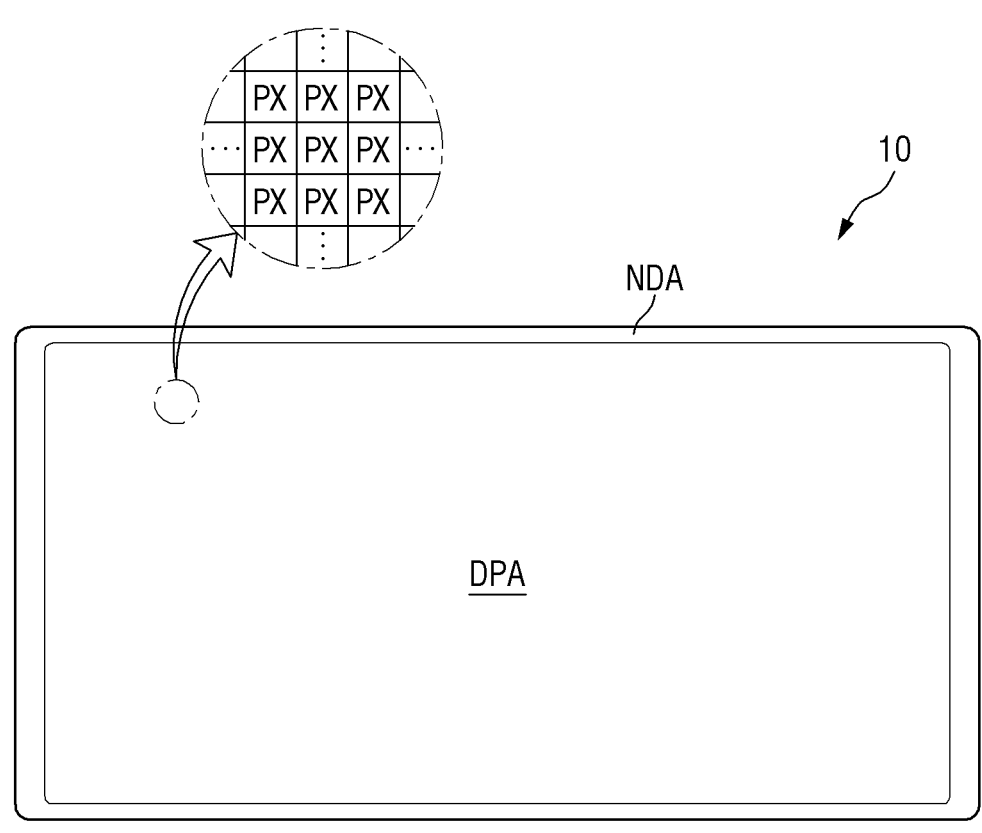
FIG. 1 is a schematic plan view illustrating a display device according to an embodiment.
Figure 1:
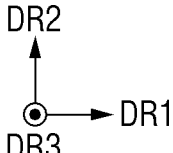

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, detailed embodiments will be described with reference to the accompanying drawings.

FIG. 1 is a schematic plan view illustrating a display device according to an embodiment.

Referring to FIG. 1, a display device 10 may display a moving image or a still image. The display device 10 may be all electronic devices that include a display screen. For example, a television, a laptop computer, a monitor, an advertising board, Internet of Things, a mobile phone, a smart phone, a tablet personal computer (PC), an electronic watch, a smart watch, a watch phone, a head mounted display, a mobile communication terminal, an electronic diary, an electronic book, a portable multimedia player (PMP), a navigator, a game machine, a digital camera, a camcorder and the like, which provide a display screen, may be included in the display device 10.

The display device 10 may include a display panel for implementing a display screen. Examples of the display panel may include an inorganic light emitting diode display panel, an organic light emitting display panel, a quantum dot light emitting display panel, a plasma display panel and a field emission display panel. Hereinafter, an inorganic light emitting diode display panel is described as an example of a display panel, but embodiments are not limited thereto. Another display panel may be used or applied in case that the same technical spirits are applicable thereto.

In the drawing in which the display device 10 is illustrated, a first direction DR1, a second direction DR2, and a third direction DR3 are defined. The first direction DR2 and the second direction DR2 may be directions perpendicular to each other on one plane. The third direction DR3 may be a direction vertical to the plane on which the first direction DR1 and the second direction DR2 are positioned. The third direction DR3 is perpendicular to each of the first direction DR1 and the second direction DR2. For example, the third direction DR3 refers to a thickness direction of the display device 10.

Various modifications may be made in a shape of the display device 10. For example, the display device 10 may have a rectangular shape that includes a long side extending in the first direction DR1 and a short side extending in the second direction DR2 on the plane. For another example, the display device 10 may have a rectangular shape that includes a long side extending in the second direction DR2 and a short side extending in the first direction DR1 on the plane. However, embodiments are not limited thereto. For example, the display device 10 may have a square shape, a square shape with rounded corners (or vertices), other polygonal shape, a circular shape, etc. A shape of a display area DPA of the display device 10 may also be similar to the overall shape of the display device 10. Referring to FIG. 1, a display device 10 and a display area DPA of rectangular shapes having long sides extending in the first direction DR1 and short sides extending in the second direction DR2, are illustrated in FIG. 1.

The display device 10 may include a display area DPA and a non-display area NDA. The display area DPA may be an area in which a screen may be displayed, and the non-display area NDA may be an area in which a screen is not displayed. The display area DPA may be referred to as an active area, and the non-display area NDA may be referred to as a non-active area. The display area DPA may generally occupy the center portion of the display device 10.

The display area DPA may include pixels PX. The pixels PX may be arranged in a matrix direction. A shape of each pixel PX may be a rectangular or square shape in a plan view, but embodiments are not limited thereto. The shape of each pixel PX may be a rhombus shape in which each side is inclined with respect to a direction. The respective pixels PX may be alternately arranged in a stripe type or a PENTILE™ type. Each of the pixels PX may include one or more light emitting elements for emitting light of a specific wavelength band to display a specific color.

The non-display area NDA may be disposed in the vicinity (or edge areas) of the display area DPA. The non-display area NDA may fully or partially surround the display area DPA. The display area DPA may be rectangular in shape, and the non-display area NDA may be adjacent to four sides of the display area DPA. The non-display area NDA may form a bezel of the display device 10. Lines or circuit drivers included in the display device 10 may be disposed in the non-display areas NDA, or external devices may be packaged therein.

Figure 2:
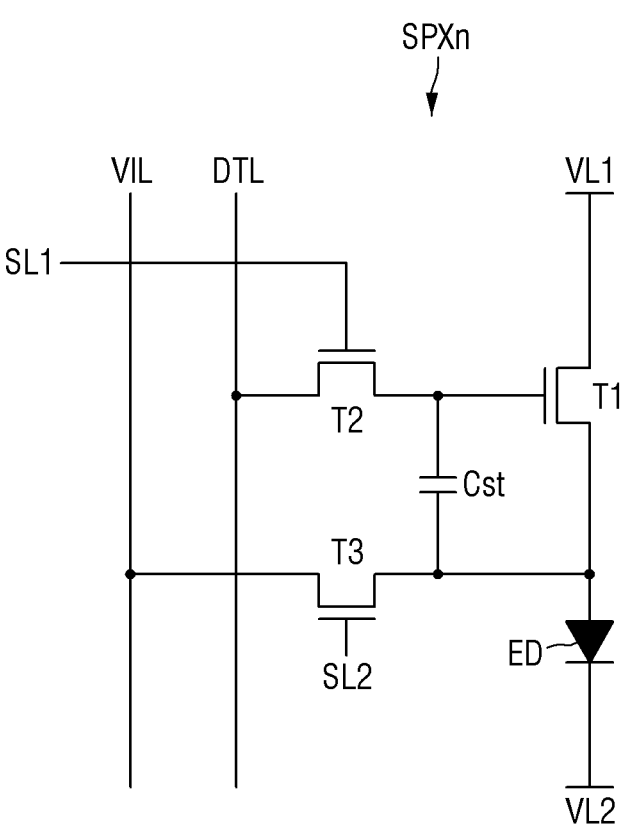
FIG. 2 is a schematic diagram illustrating an equivalent circuit of a subpixel of a display device according to an embodiment.

FIG. 2 is a schematic diagram illustrating an equivalent circuit of a subpixel according to an embodiment.

Referring to FIG. 2, each subpixel SPXn of the display device 10 according to an embodiment may include three transistors T1, T2 and T3 and a storage capacitor Cst in addition to a light emitting element ED (e.g., a light emitting diode).

The light emitting element ED may emit light in accordance with a current supplied through the first transistor T1. The light emitting element ED may emit light of a specific wavelength band by an electrical signal transferred from a first electrode and a second electrode, which are connected to both end portions.

An end portion of the light emitting element ED may be connected to a source electrode of the first transistor T1, and the other end portion of the light emitting element ED may be connected to a second voltage line VL2 supplied with a low potential voltage (hereinafter, a second power voltage) lower than a high potential voltage (hereinafter, a first power voltage) of a first voltage line VL1.

The first transistor T1 may adjust or control a current flowing from the first voltage line VL1, to which the first power voltage is supplied, to the light emitting element ED in accordance with a voltage difference between a gate electrode and the source electrode. For example, the first transistor T1 may be a driving transistor for driving the light emitting element ED. The gate electrode of the first transistor T1 may be connected to a source electrode of the second transistor T2, and the source electrode of the first transistor T1 may be connected to an end portion of the light emitting element ED. A drain electrode of the first transistor T1 may be connected to the first voltage line VL1 to which the first power voltage is applied.

The second transistor T2 may be turned on by a scan signal of a first scan line SL1 to connect a data line DTL to the gate electrode of the first transistor T1. A gate electrode of the second transistor T2 may be connected to the first scan line SL1, the source electrode thereof may be connected to the gate electrode of the first transistor T1, and a drain electrode thereof may be connected to the data line DTL.

The third transistor T3 may be turned on by a scan signal of a second scan line SL2 to connect an initialization voltage line VIL to an end portion of the light emitting element ED. A gate electrode of the third transistor T3 may be connected to the second scan line SL2, a drain electrode of the third transistor T3 may be connected to the initialization voltage line VIL, and a source electrode of the third transistor T3 may be connected to an end portion of the light emitting element ED or the source electrode of the first transistor T1. Although the first scan line SL2 and the second scan line SL2 are shown as being separated from each other, embodiments are not limited thereto. In some embodiments, the first scan line SL1 and the second scan line SL2 may be made of a single line, and the second transistor T2 and the third transistor T3 may be simultaneously turned on by the same scan signal.

In an embodiment, the source and drain electrodes of each of the transistors T1, T2 and T3 are not limited to those described above, and may be opposite cases of those described above. Each of the transistors T1, T2 and T3 may be formed as a thin film transistor. In FIG. 2, each of the transistors T1, T2 and T3 may be formed as an N-type metal oxide semiconductor field effect transistor (MOSFET), but embodiments are not limited thereto. For example, each of the transistors T1, T2 and T3 may be formed as a P-type MOSFET, or a portion of the transistors T1, T2 and T3 may be an N-type MOSFET and the other portion may be formed as a P-type MOSFET.

The storage capacitor Cst may be connected to the gate electrode and the source electrode of the first transistor T1. The storage capacitor Cst may store or charge a differential voltage of a gate voltage and a source voltage of the first transistor T1.

Hereinafter, a structure of a pixel PX of the display device 10 according to an embodiment will be described in detail with reference to another drawing.

Figure 3:
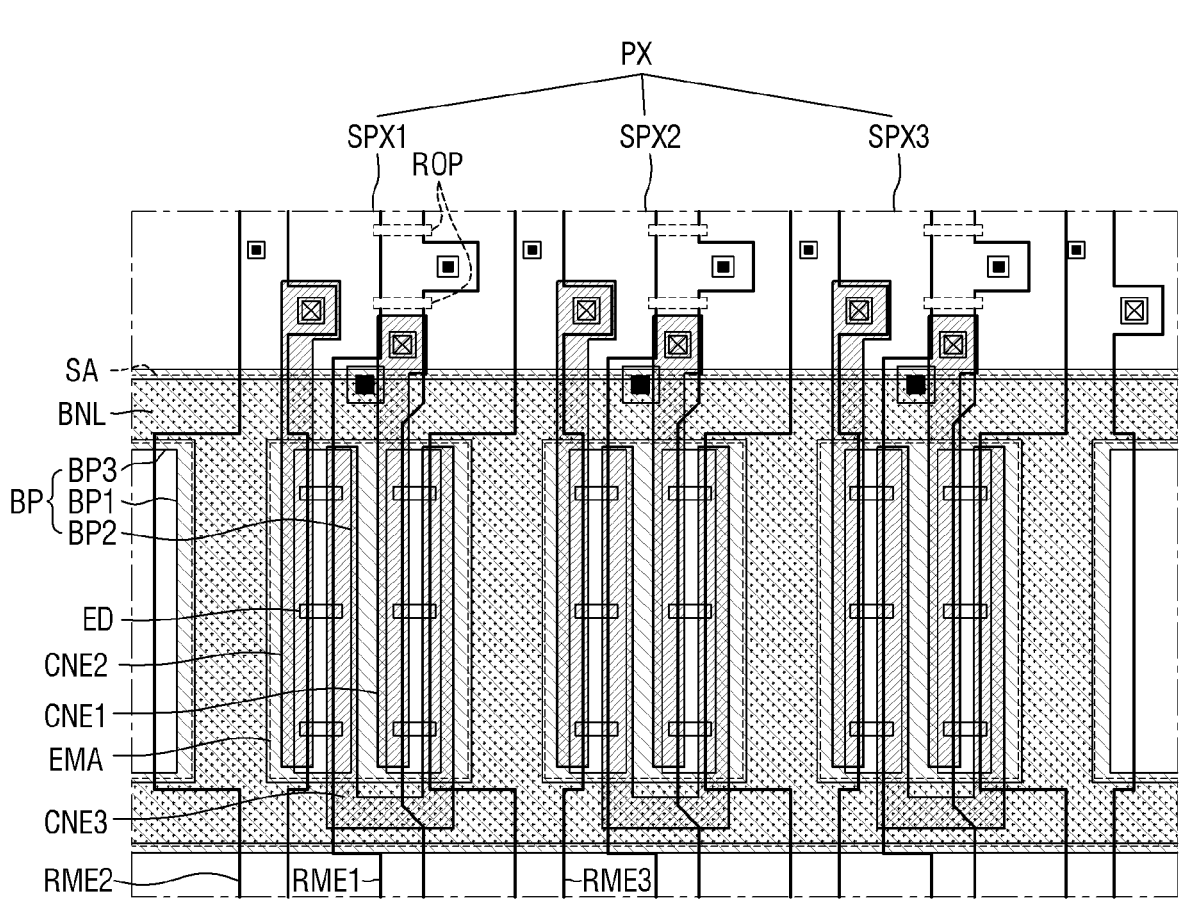
FIG. 3 is a schematic plan view illustrating a pixel of a display device according to an embodiment.
Figure 3:
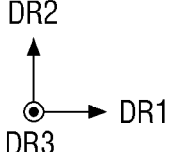

FIG. 3 is a schematic plan view illustrating a pixel of a display device according to an embodiment.

Figure 4:
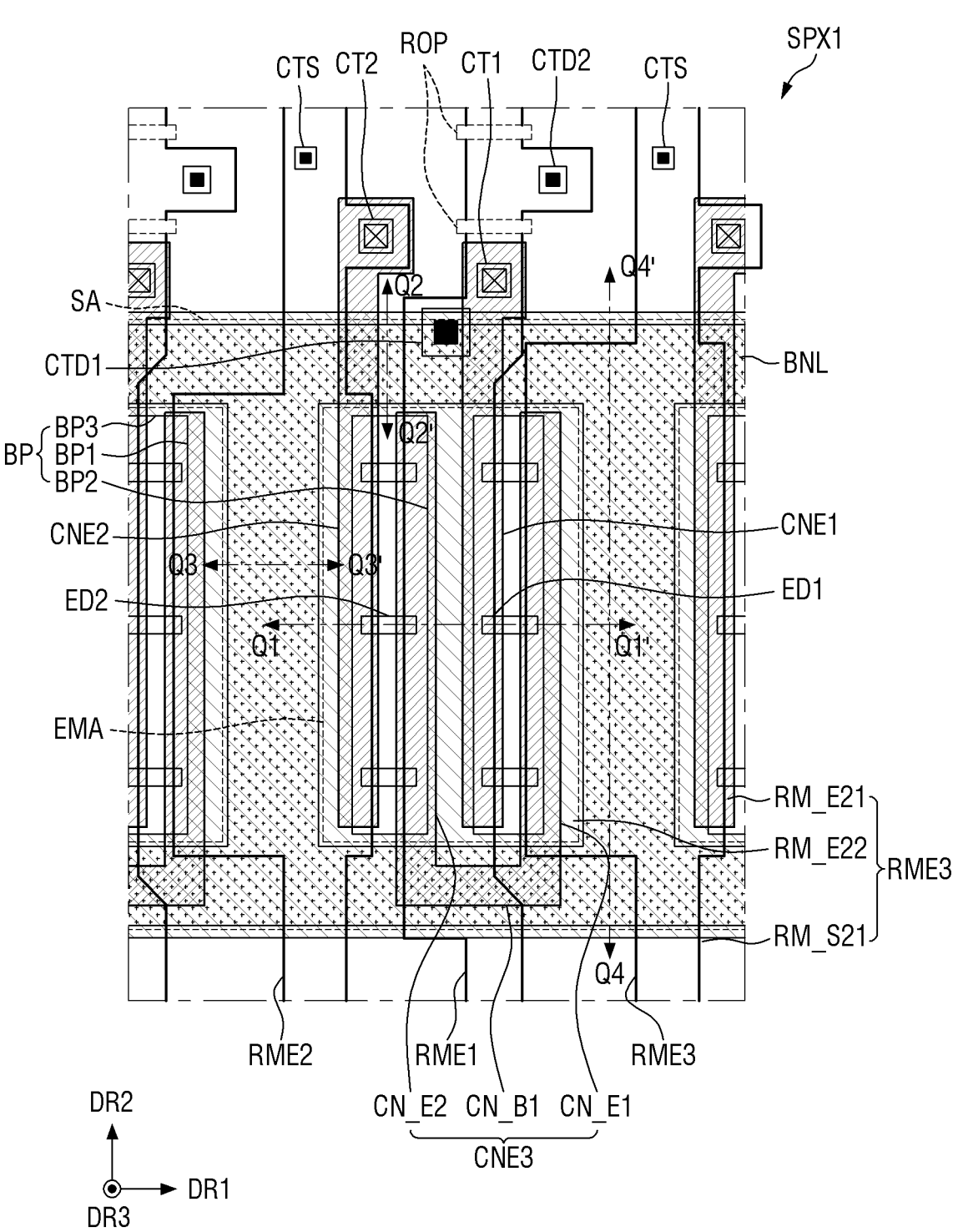
FIG. 4 is a schematic plan view illustrating a subpixel of FIG. 3.

Referring to FIG. 4, each of the pixels PX of the display device 10 may include subpixels SPXn (where n is an integer of 1 to 3). For example, the pixel PX may include a first subpixel SPX1, a second subpixel SPX2 and a third subpixel SPX3. The first subpixel SPX1 may emit light of a first color, the second subpixel SPX2 may emit light of a second color, and the third subpixel SPX3 may emit light of a third color. For example, the first color may be blue, the second color may be green, and the third color may be red. However, embodiments are not limited thereto. For example, the respective subpixels SPXn may emit light of the same color. In another example, the respective subpixels SPXn may emit light of a blue color. Also, although one pixel PX is illustrated as including three subpixels SPXn, the pixel PX may include subpixels SPXn more than three.

Each of the subpixels SPXn of the display device 10 may include an emission area EMA (e.g., a light emission area) and a non-light emission area. The emission area EMA may be an area in which the light emitting elements ED are disposed so that light of a specific wavelength band is emitted. The non-light emission area may be an area in which the light emitting elements ED are not disposed and light emitted from the light emitting elements ED does not reach there so that the light is not emitted. The emission area EMA may include an area in which the light emitting elements ED are disposed, and thus may include an area in which light emitted from the light emitting elements ED is emitted to an area adjacent to the light emitting elements ED.

For example, the emission area EMA may also include an area in which light emitted from the light emitting elements ED is reflected or refracted by another member. The light emitting elements ED may be disposed in each subpixel SPXn, and the area in which the light emitting elements ED are disposed and its adjacent area may form the emission area EMA.

The emission areas EMA of the respective subpixels SPXn are illustrated to have a uniform size, but embodiments are not limited thereto. In some embodiments, the emission areas EMA of the respective subpixels SPXn may have their respective sizes different from each other according to the color or wavelength band of light emitted from the light emitting element ED disposed in the corresponding subpixel SPXn.

For example, each subpixel SPXn may further include a sub-area SA disposed in the non-light emission area. The sub-area SA may be adjacent to the emission area EMA in the second direction DR2. For example, the sub-area SA may be disposed between the emission areas EMA of the subpixels SPXn, which are adjacent to each other in the second direction DR2. For example, the emission areas EMA may be spaced apart from each other in the first direction DR1, and the emission areas EMA and the sub-areas SA may be repeatedly arranged in the second direction DR2, and may be alternately arranged, but embodiments are not limited thereto. The emission areas EMA and the sub-areas SA in the pixels PX may have an arrangement different from that of FIG. 3. In the pixel PX shown in FIG. 3, the emission area EMA and the sub-area SA disposed above the emission area EMA in the second direction DR2 may be included in a subpixel SPXn. For example, a portion disposed in an opposite direction of the second direction DR2 may be a sub-area SA of another subpixel SPXn. In an embodiment, the sub-area SA may be continuously disposed in each subpixel SPXn, and may be continuously disposed in each pixel PXn.

A bank layer BNL may be disposed between the sub-area SA and the emission areas EMA, and a distance (or gap) between the sub-areas SA and the emission areas EMA may vary according to a width of the bank layer BNL. Since the light emitting element ED is not disposed in the sub-area SA, light may not be emitted from the sub-area SA but a portion of electrodes RME1, RME2 and RME3 disposed in each subpixel SPXn may be disposed in the sub-area SA. The electrodes RME disposed in different subpixels SPXn may be spaced apart from each other by a dam portion (or a partition portion) ROP of the sub-area SA.

The bank layer BNL may include portions extending in the first direction DR1 and the second direction DR2 in a plan view, and thus may be disposed on the surface (e.g., the entire surface) of the display area DPA in a ladder pattern. The bank layer BNL may be disposed over a boundary area of the respective subpixels SPXn to define or distinguish the subpixels SPXn adjacent to each other. For example, the bank layer BNL may surround the emission area EMA disposed for each subpixel SPXn, thereby defining or distinguishing the emission area EMA from the sub-area SA.

A bank pattern layer BP may include portions extending in the first direction DR1 and the second direction DR2 on a plane (or in a plan view), and thus may be disposed on the entire surface of the display area DPA in a ladder pattern. In the same manner as the bank layer BNL, the bank pattern layer BP may be disposed over a boundary area of the respective subpixels SPXn to define or distinguish the subpixels SPXn adjacent to each other. The bank pattern layer BP may surround the light emitting elements ED, thereby defining or distinguishing the light emitting elements ED. The bank pattern layer BP will be described below in detail.

The display device 10 may include electrodes RME (e.g., RME1, RME2, and RME3), a bank pattern layer BP, light emitting elements ED (e.g., ED1 and ED2), and connection electrodes CNE (e.g., CNE1, CNE2, and CNE3). These elements will be described below.

Each pixel PX or subpixel SPXn of the display device 10 may include a pixel driving circuit. The above-described lines may apply a driving signal to each pixel driving circuit with passing through each pixel PX or through the periphery of each pixel PX. The pixel driving circuit may include a transistor and a capacitor. Various modifications may be made in the number of transistors and capacitors of each pixel driving circuit. According to an embodiment, each subpixel SPX of the display device 10 may have a 3T-1C structure as shown in FIG. 2, in which the pixel driving circuit includes three transistors and one capacitor, but embodiments are not limited thereto. Various modified pixel structures such as a 2T-1C structure having two transistors and one capacitor, a 7T-1C structure having seven transistors and one capacitor and a 6T-1C structure having six transistors and one capacitor may be applied to the pixel driving circuit.

Figure 5:
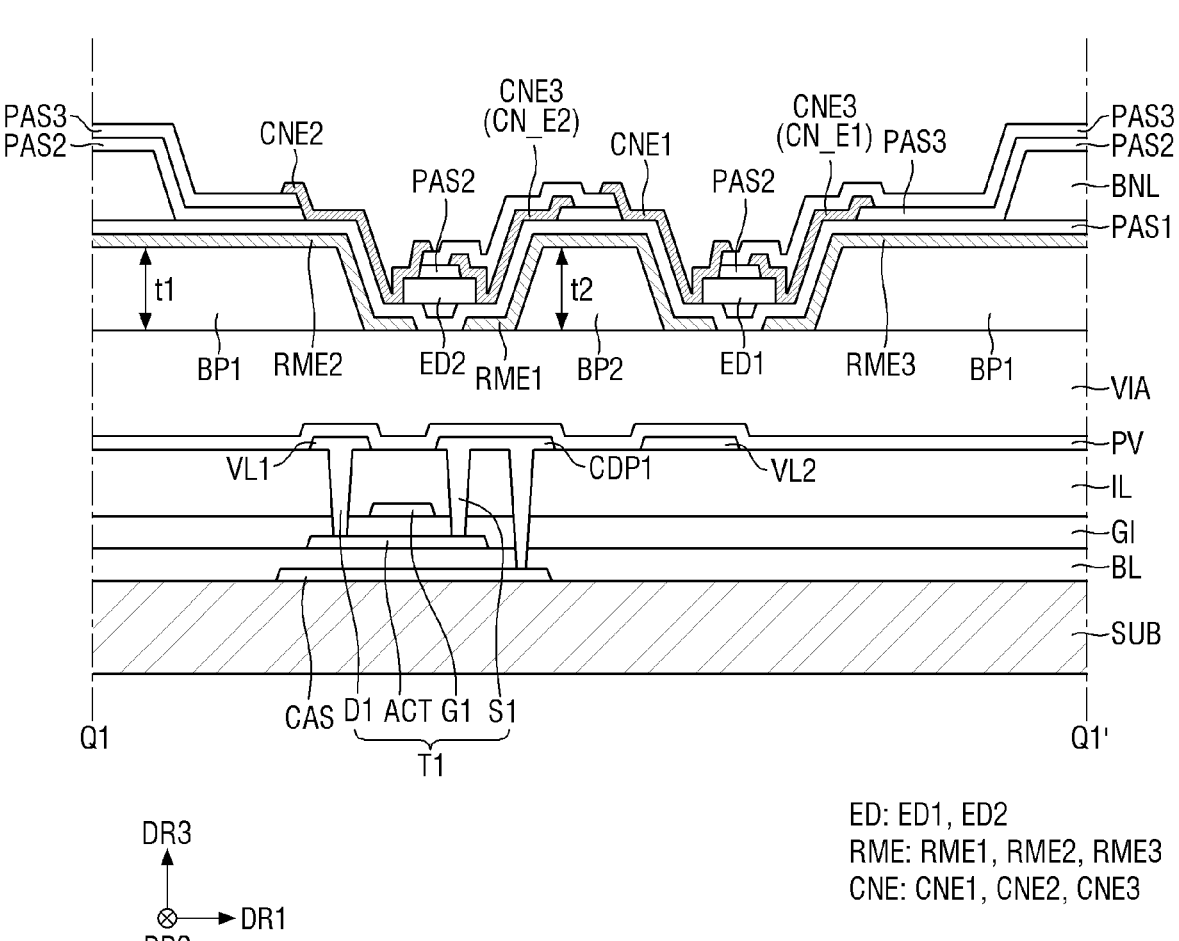
FIG. 5 is a schematic cross-sectional view taken along line Q1-Q1' of FIG. 4.
Figure 6:
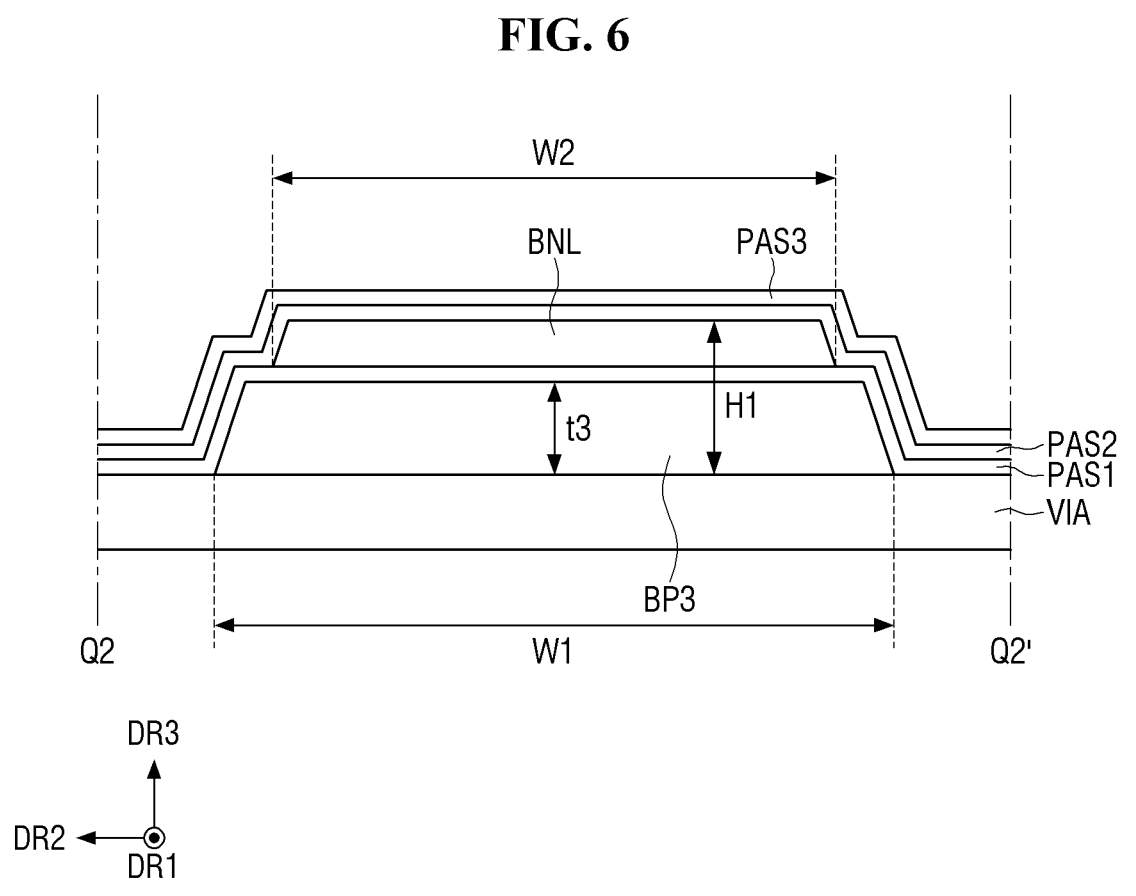
Figure 7:
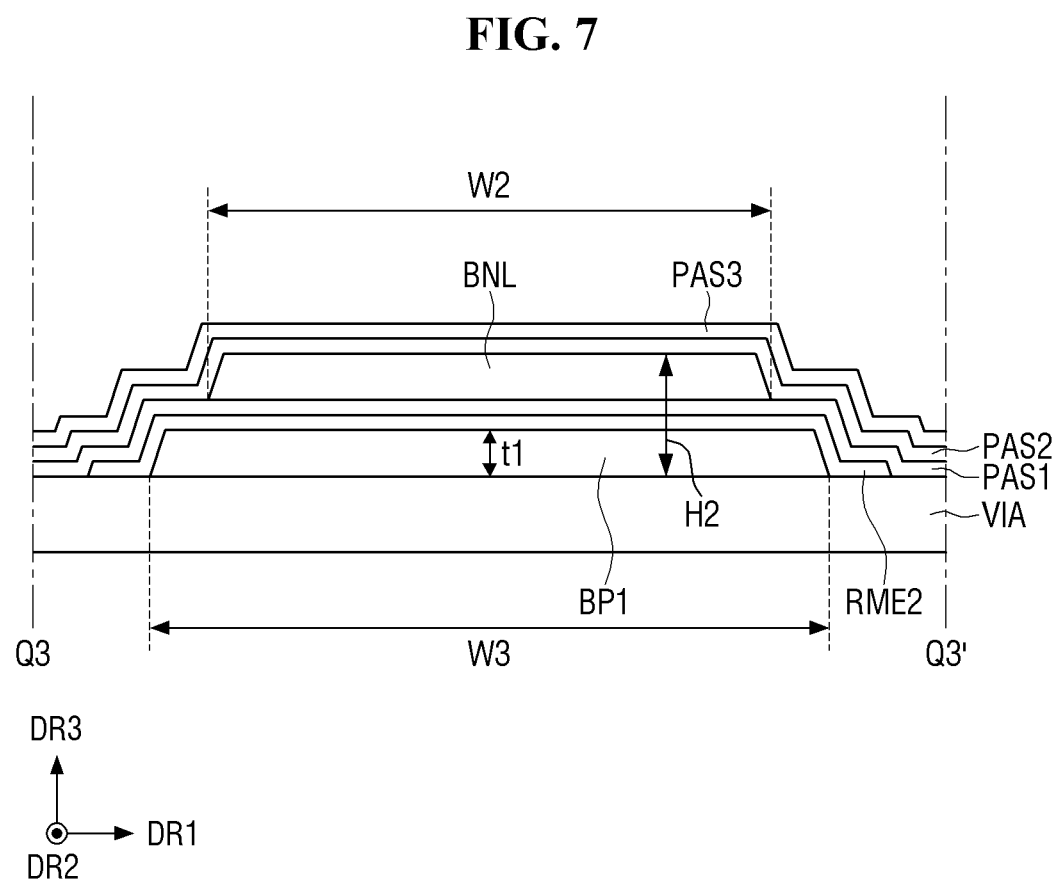
Figure 8:
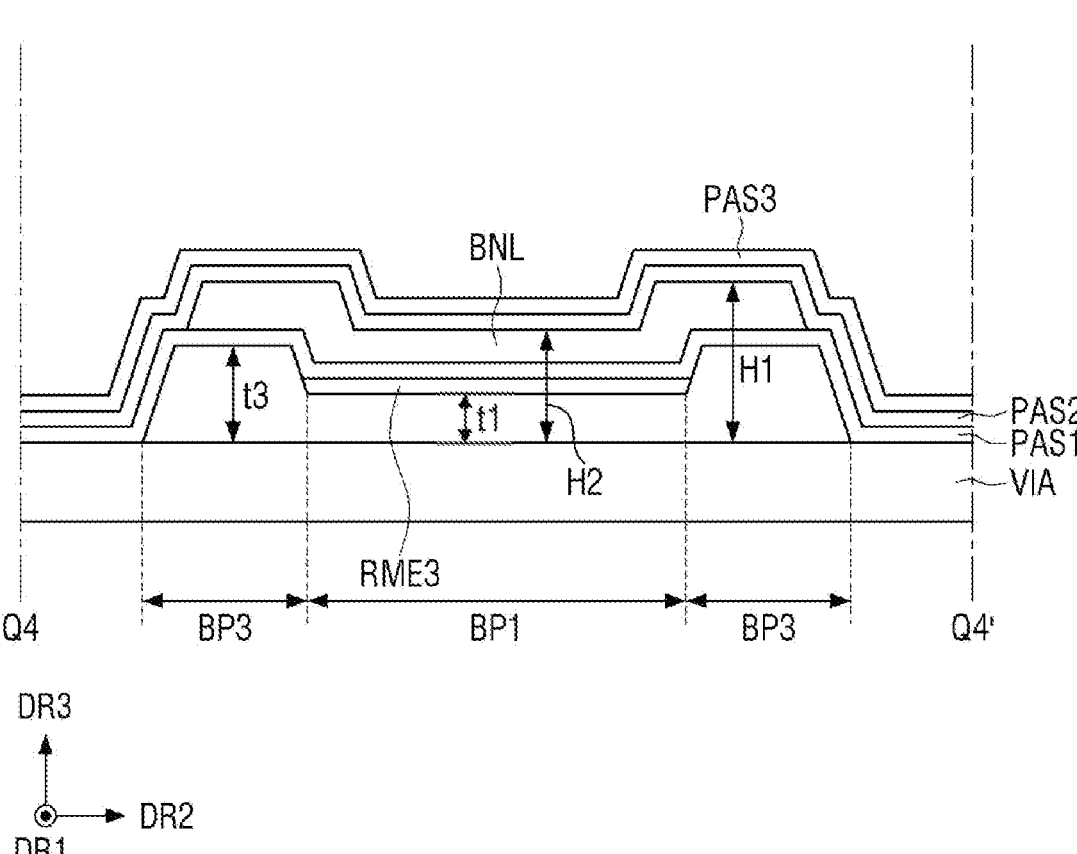
FIG. 8 is a schematic cross-sectional view taken along line Q4-Q4' of FIG. 4.
Figure 9:
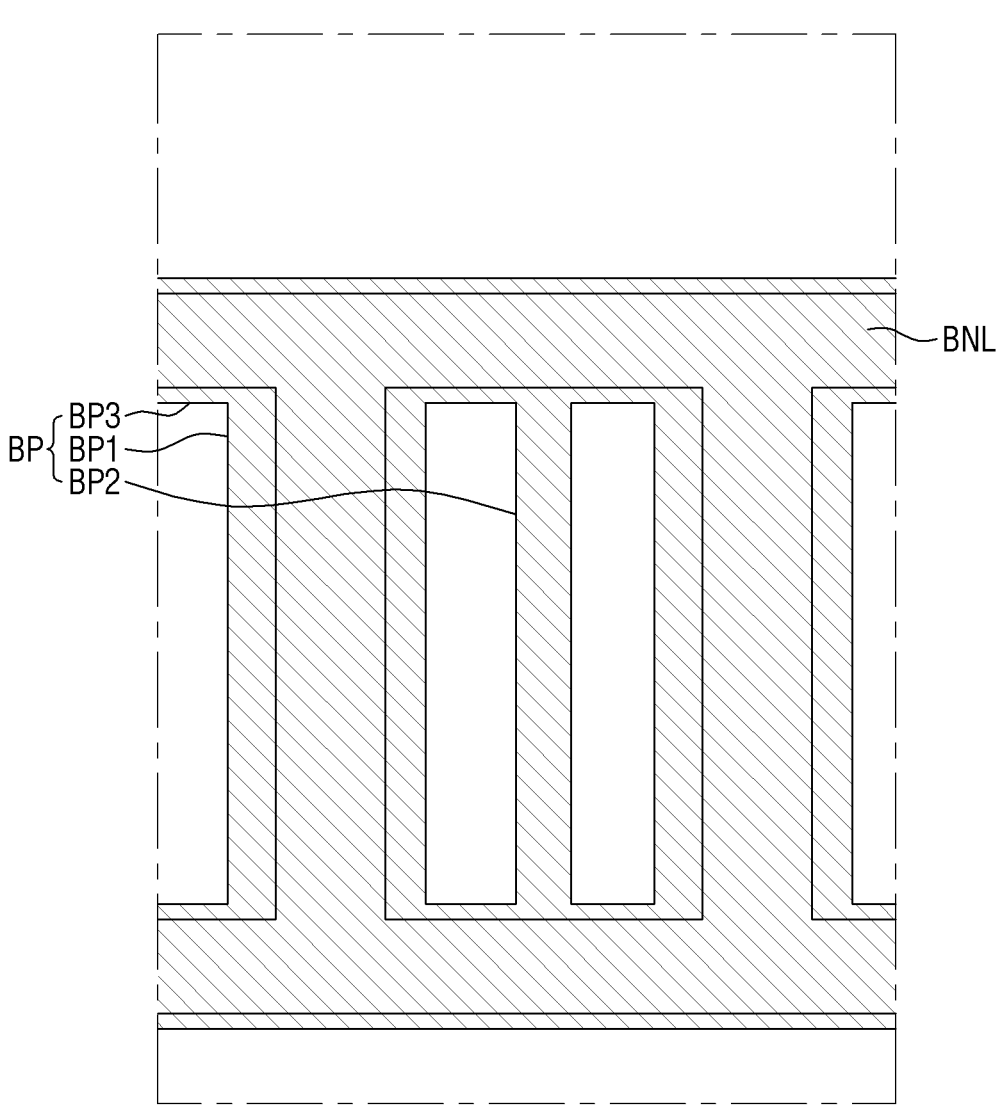
FIG. 9 is a schematic plan view illustrating shapes of a bank layer and a bank pattern layer.
Figure 9:
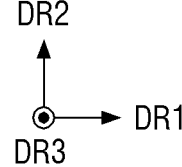

FIG. 4 is a schematic plan view illustrating a subpixel of FIG. 3. FIG. 5 is a schematic cross-sectional view taken along line Q1-Q1' of FIG. 4. FIG. 6 is a cross-sectional view taken along line Q2-Q2' of FIG. 4. FIG. 7 is a schematic cross-sectional view taken along line Q3-Q3' of FIG. 4. FIG. 8 is a schematic cross-sectional view taken along line Q4-Q4' of FIG. 4. FIG. 9 is a schematic plan view illustrating shapes of a bank layer and a bank pattern layer.

Referring to FIGS. 4 to 9 in conjunction with FIG. 3, the display device 10 may include a substrate SUB, a semiconductor layer disposed on the substrate SUB, conductive layers, and insulating layers. The semiconductor layer, the conductive layer and the insulating layers may form a circuit layer and a display element layer of the display device 10, respectively.

For example, the substrate SUB may be an insulating substrate. The substrate SUB may be made of an insulating material such as glass, quartz or polymer resin. The substrate SUB may be a rigid substrate, but may be a flexible substrate that is bendable, foldable, rollable, or the like.

A first conductive layer may be disposed on the substrate SUB. The first conductive layer may include a lower metal layer CAS that overlaps an active layer ACT of the first transistor T1. The lower metal layer CAS may include a light shielding material to prevent light from entering or transmitting the active layer ACT of the first transistor. However, the lower metal layer CAS may be omitted.

A buffer layer BL may be disposed on the lower metal layer CAS and the substrate SUB. The buffer layer BL may be formed on the substrate SUB to protect the transistors from water permeated through the substrate SUB, which is vulnerable to moisture permeation, and may provide (or form) a polarization surface by a surface planarization function.

The semiconductor layer may be disposed on the buffer layer BL. The semiconductor layer may include the active layer ACT of the first transistor T1. The active layer ACT may partially overlap a gate electrode G1 of a second conductive layer, which will be described below.

The semiconductor layer may include polycrystalline silicon, monocrystalline silicon, an oxide semiconductor, and the like. In another example, the semiconductor layer may include polycrystalline silicon. The oxide semiconductor may be an oxide semiconductor containing indium (In). For example, the oxide semiconductor may be at least one of Indium Tin Oxide (ITO), Indium Zinc Oxide (IZO), Indium Gallium Oxide (IGO), Indium Zinc Tin Oxide (IZTO), Indium Gallium Tin Oxide (IGTO), Indium Gallium Zinc Oxide (IGZO), or Indium Gallium Zinc Tin Oxide (IGZTO).

Although a single first transistor T1 is illustrated as being disposed in the subpixel SPXn of the display device 10, embodiments are not limited thereto. The display device 10 may include a larger number of transistors.

A gate insulating layer GI may be disposed on the active layer ACT. The gate insulating layer GI may function as a gate insulating layer of the first transistor T1.

The second conductive layer may be disposed on the gate insulating layer GI. The second conductive layer may include a gate electrode G1 of the first transistor T1. The gate electrode G1 may overlap a channel area of the active layer ACT in a third direction DR3 (e.g., a thickness direction).

An interlayer insulating layer IL may be disposed on the second conductive layer. The interlayer insulating layer IL may function as an insulating layer between the second conductive layer and other layers disposed on the second conductive layer, and may protect the second conductive layer.

A third conductive layer may be disposed on the interlayer insulating layer IL. The third conductive layer may include a first voltage line VL1, a second voltage line VL2, and a conductive pattern layer CDP1.

The high potential voltage (or first power voltage) transferred to the first electrode RME1 may be applied to the first voltage line VL1, and the low potential voltage (or second power voltage) transferred to the second electrode RME2 may be applied to the second voltage line VL2. A portion of the first voltage line VL1 may be in contact with the active layer ACT of the first transistor T1 through a contact hole that passes through the interlayer insulating layer IL and the gate insulating layer GI. The first voltage line VL1 may function as a first drain electrode D1 of the first transistor T1. The second voltage line VL2 may be connected (e.g., directly connected) to the first connection electrode CNE1 that will be described below. Also, the first voltage VL1 may be connected (e.g., electrically connected) to the first connection electrode CNE1 that will be described below. The second voltage line VL2 may be connected (e.g., directly connected) to the second electrode RME2 that will be described below.

The conductive pattern layer CDP1 may be in contact with the active layer ACT of the first transistor T1 through the contact hole that passes through the interlayer insulating layer IL and the gate insulating layer GI. For example, the conductive pattern layer CDP1 may be in contact with the lower metal layer CAS through another contact hole. The conductive pattern layer CDP1 may function as a first source electrode S1 of the first transistor T1.

A passivation layer PV may be disposed on the third conductive layer and the interlayer insulating layer IL. The passivation layer PV may function as an insulating layer between the third conductive layer and other layers disposed on the third conductive layer, and may protect the third conductive layer.

The buffer layer BL, the gate insulating layer GI, the interlayer insulating layer IL and the passivation layer PV may be formed of inorganic layers that are alternately stacked. For example, the buffer layer BL, the gate insulating layer GI, the interlayer insulating layer IL and the passivation layer PV may be formed of a double layer in which inorganic layers including at least one of silicon oxide ($SiO_x$), silicon nitride ($SiN_x$), or silicon oxynitride ($SiO_xN_y$) are stacked, or multiple layers in which the inorganic layers are alternately stacked, but embodiments are not limited thereto. The buffer layer BL, the gate insulating layer GI, the interlayer insulating layer IL and the passivation layer PV may be made of an inorganic layer including the insulating material described above. Also, in some embodiments, the interlayer insulating layer IL may be made of an organic insulating material such as polyimide (PI).

The second conductive layer and the third conductive layer may be formed of a single layer or multiple layers made of one of molybdenum (Mo), aluminum (Al), chromium (Cr), gold (Au), titanium (Ti), nickel (Ni), neodymium (Nd) and copper (Cu), or their alloy, but embodiments are not limited thereto.

A via layer VIA may be disposed on the passivation layer PV. The via layer VIA may include an organic insulating material such as polyimide (PI) to perform a surface planarization function.

The electrodes RME (e.g., RME1, RME2 and RME3), bank pattern layers BP (e.g., BP1, BP2 and BP3), the light emitting elements ED (e.g., ED1 and ED2), and the connection electrodes CNE (e.g., CNE1, CNE2 and CNE3) may be disposed on the via layer VIA as display element layers. For example, insulating layers PAS1, PAS2 and PAS3 may be disposed on the via layer VIA.

The bank pattern layers BP may be disposed (e.g., directly disposed) on the via layer VIA. The bank pattern layers BP may include first bank pattern layers BP1, second bank pattern layers BP2 and third bank pattern layers BP3.

The first bank pattern layers BP1 may be disposed over the emission area EMA and the non-light emission area of the subpixel SPXn. The first bank pattern layers BP1 may be disposed over the subpixels SPXn adjacent to each other in the first direction DR1. The first bank pattern layers BP1 may have a shape extending in the second direction DR2, and may be spaced apart from each other in the first direction DR1. The first bank pattern layers BP1 may have the same width, but embodiments are not limited thereto, and may have their respective widths different from each other. A length of the first bank pattern layers BP1, which extends in the second direction DR2, may be shorter than that of the emission area EMA extending in the second direction DR2 and surrounded by the bank layer BNL.

The second bank pattern layer BP2 may be disposed in the emission area EMA of the subpixel SPXn, and may have a shape extending in the second direction DR2. The second bank pattern layer BP2 may be disposed between the first bank pattern layers BP1, and may be spaced apart from the first bank pattern layers BP1. The second bank pattern layer BP2 may extend in the second direction DR2 with a narrow width in the emission area EMA of each subpixel SPXn on the front surface of the display area DPA.

The third bank pattern layer BP3 may be disposed over the emission area EMA and the non-light emission area of the subpixel SPXn. The third bank pattern layers BP3 may be disposed between the emission area EMA and the sub-area SA of the subpixel SPXn, which are adjacent to each other in the second direction DR2. The third bank pattern layers BP3 may have a shape extending in the first direction DR1, and may be spaced apart from each other in the second direction DR2. The first bank pattern layers BP1 and the second bank pattern layers BP2, which are disposed between the third bank pattern layers BP3, may be disposed continuously in the third bank pattern layers BP3 and integral with each other. For example, the first and second bank pattern layers BP1 and BP2 may extend to be diverged from the third bank pattern layer BP3 in the second direction DR2, and may be combined with the third bank pattern layer BP3 spaced apart therefrom in the second direction DR2.

The second bank pattern layer BP2 may be disposed at the center area of the emission area EMA, and the first bank pattern layers BP1 may be spaced apart from each other with the second bank pattern layer BP2 interposed therebetween. The third bank pattern layer BP3 may be disposed on upper and lower portions of the emission area EMA. The first and second bank pattern layers BP1 and BP2 may be alternately disposed along the first direction DR1. The light emitting elements ED may be disposed between the first bank pattern layer BP1 and the second bank pattern layer BP2. For example, light emitting elements ED may be disposed in an area surrounded by the first bank pattern layer BP1, the second bank pattern layer BP2 and the third bank pattern layers BP3.

The first bank pattern layers BP1 and the second bank pattern layer BP2 have the same length in the second direction DR2, but may have different widths measured in the first direction DR1. A portion of the bank layer BNL, which extends in the second direction DR2, may overlap the first bank pattern layer BP1 in the thickness direction (e.g., third direction DR3). For example, a portion of the bank layer BNL, which extends in the first direction DR1, may overlap the third bank pattern layer BP3 in the thickness direction (e.g., the third direction DR3). The second bank pattern layer BP2 may not overlap the bank layer BNL. The bank pattern layer BP may be disposed on the front surface of the display area DPA in a ladder pattern.

The bank pattern layers BP may have a structure in which at least a portion of the bank pattern layer BP is protruded based on an upper surface of the via layer VIA. The protruded portion of the bank pattern layers BP may have an inclined or curved side. For example, each element of the bank pattern layers BP may have an outer surface of a semi-circular shape or a semi-elliptical shape. The bank pattern layers BP may include, but embodiments are not limited thereto, organic insulating materials such as poly-imide PI.

In case that the amount of ink applied to the subpixels SPXn is large, the ink may overflow to the sub-area SA disposed in the first direction DR1 by passing through the bank layer BNL. For example, inks may exist in the dam portion (or the partition portion) ROP of the sub-area SA, whereby the first electrode RME1 disposed in the dam portion (or the partition portion) ROP may not be separated in a subsequent process to cause a bright spot defect. For example, a contact defect of the light emitting elements ED and the connection electrodes CNE may occur, whereby a dark spot defect may occur, or film tearing may occur due to an adhesive defect of the layers formed on the upper portion of the ink.

In an embodiment, the third bank pattern layer BP3 may be formed between the emission area EMA and the sub-area SA so that the bank layer BNL disposed on the third bank pattern layer BP3 may be formed to have a high height. The third bank pattern layer BP3 of the bank pattern layer BP may extend in the first direction DR1, and may define (or partition) the emission area EMA and the sub-area SA therebetween. The third bank pattern layer BP3 may overlap the bank layer BNL extending in the first direction DR1 so that the bank layer BNL may be formed to have a high height. In case that ink including the light emitting element ED is applied to the emission area EMA, the third bank pattern layer BP3 may prevent or block the ink may from overflowing to the sub-area SA by the bank layer BNL formed to be high.

As shown in FIGS. 4 and 6, a width W1 of the third bank pattern layer BP3 in the second direction DR2 may be greater than a width W2 of the bank layer BNL that overlaps the third bank pattern layer BP3. The first connection electrode CNE1 and the second connection electrode CNE2, which will be described below, may be disposed over the emission area EMA and the sub-area SA on the bank layer BNL. In case that the height of the bank layer BNL is high, the connection of the first connection electrode CNE1 and the second connection electrode CNE2 may be disconnected due to a large step difference caused by the the the third bank pattern layer BP3 and the bank layer BNL. In an embodiment, the width W1 of the third bank pattern layer BP3 disposed below the bank layer BNL may be greater than the width W2 of the bank layer BNL to form a step between the third bank pattern layer BP3 and the bank layer BNL. The first connection electrode CNE1 and the second connection electrode CNE2 may be formed along the step formed between the third bank pattern layer BP3 and the bank layer BNL, thereby preventing a short circuit (or an open circuit) from occurring.

For example, in case that the ink is applied to the emission area EMA of each subpixel SPXn, the ink may be prevented from spreading in the second direction DR2 by the bank layer BNL disposed between the emission area EMA and the sub-area SA, and may spread in the first direction DR1. In an embodiment, the thickness t1 of the first bank pattern layer BP1 may be reduced so that the ink may spread in the first direction DR1 of each of the adjacent subpixels SPXn.

As shown in FIGS. 6 to 8, the first bank pattern layers BP1 may be disposed below the bank layer BNL disposed between the subpixels SPXn adjacent to each other in the first direction DR1. In an embodiment, a thickness t1 of the first bank pattern layers BP1 may be smaller than a thickness t3 of the third bank pattern layer BP3. A height H2 of an upper surface of the bank layer BNL disposed on the first bank pattern layers BP1 may be lower than a height H1 of an upper surface of the bank layer BNL disposed on the third bank pattern layers BP3. For example, the heights H1 and H2 of the upper surface of the bank layer BNL may mean a distance from the upper surface of the via layer VIA to the upper surface of the bank layer BNL. The ink applied to the emission area EMA of each subpixel SPXn may be prevented from spreading in the second direction DR2 by the third bank pattern layer BP3 and the bank layer BNL overlapping the third bank pattern layer BP3, and may readily spread in the first direction DR1 by the first bank pattern layer BP1, which is relatively low, and the bank layer BNL overlapping the first bank pattern layer BP1.

A width W3 of the first bank pattern layer BP1 may be greater than the width W2 of the bank layer BNL overlapping the first bank pattern layer BP1, but embodiments are not limited thereto. The width W3 of the first bank pattern layer BP1 may be substantially equal to the width W2 of the bank layer BNL overlapping the first bank pattern layer BP1.

In an embodiment, the third bank pattern layer BP3 may be formed between the emission area EMA and the sub-area SA so that the height H1 of the upper surface of the bank layer BNL is formed to be high, thereby preventing the ink applied to the emission area EMA from overflowing to the sub-area SA. Therefore, a bright spot, a dark spot and film tearing, which may occur due to overflowing of the ink to the dam portion (or the partition portion) ROP of the sub-area SA, may be prevented or minimized.

For example, the thickness t1 of the first bank pattern layer BP1 disposed between the subpixels SPXn in the first direction DR1 may be smaller than the thickness t3 of the third bank pattern layer BP3, so that the height H2 of the upper surface of the bank layer BNL overlapping the first bank pattern layer BP1 may be reduced. Therefore, the ink applied to the emission area EMA may be induced to spread to the subpixels SPXn adjacent to each other in the first direction DR1, thereby preventing the ink from overflowing to the sub-area SA, and uniformly maintaining the thickness of the ink applied to the respective subpixels SPXn SA.

The electrodes RME may be disposed on the via layer VIA and the bank pattern layer BP. The electrodes RME may be disposed in each subpixel SPXn in a shape extending in a direction. The electrodes RME may extend in the second direction DR2, and thus may be disposed over the emission area EMA and the sub-area SA of the subpixel SPXn, which may be spaced apart from each other in the first direction DR1.

The display device 10 may include a first electrode RME1, a second electrode RME2 and a third electrode RME3, which are disposed in each subpixel SPXn. For example, the first electrode RME1 may be disposed on the center area of the emission area EMA, and may be disposed between the second electrode RME2 and a third electrode RME3 in the first direction DR1. For example, the second electrode RME2 may be disposed on a left side of the emission area EMA by being spaced apart from the first electrode RME1 in the first direction DR1. For example, the third electrode RME3 may be disposed on a right side of the emission area EMA by being spaced apart from the first electrode RME1 in the first direction DR1.

The first electrode RME1 may be disposed on the second bank pattern layer BP2 disposed on the center area of the emission area EMA. The second electrode RME2 may be disposed on the first bank pattern layer BP1 disposed on the left side of the emission area EMA. The third electrode RME3 may be disposed on the first bank pattern layer BP1 disposed on the right side of the emission area EMA. The electrodes RME may be disposed on an inclined side of each of the bank pattern layers BP. In an embodiment, the width of the first electrode RME1 in the first direction DR1 may be greater than that the second bank pattern layer BP2 in the first direction DR1 in a plan view. The widths of second electrode RME2 and the third electrode RME3 in the first direction DR1 may be greater than the first bank pattern layer BP1 in the first direction DR1 in a plan view. At least some areas of the respective electrodes RME may be disposed (e.g., directly disposed) on the via layer VIA, and thus the respective electrodes RME may be disposed on the same plane (e.g., the upper surface of the via layer VIA).

In an embodiment, the first electrode RME1 may be disposed one by one in each subpixel SPXn, and the second electrode RME2 and the third electrode RME3 may be disposed over another subpixels SPXn adjacent to each other in the first direction DR1. A portion of the second electrode RME2 may be adjacent to and opposite to the first electrode RME1, and another portion of the second electrode RME2 may be disposed in another subpixels SPXn that are spaced apart from each other in the first direction DR1. A portion of the third electrode RME3 may be disposed in another subpixels SPXn that are spaced apart from each other in the first direction DR1, and another portion of the third electrode RME3 may be adjacent to and opposite to the first electrode RME1.

The first electrode RME1, the second electrode RME2 and the third electrode RME3 may be disposed in the emission area EMA of the first subpixel SPX1. For convenience of description, the second electrode RME2 and the third electrode RME3 will be described as being separately defined, but the second and third electrodes RME2 and RME3 may be a single electrode. For example, the third electrode RME3 may be the second electrode RME2 in view of another subpixels SPXn that are spaced apart from each other in the first direction DR1.

The first electrode RME1, the second electrode RME2 and the third electrode RME3 may be connected to the third conductive layer through a first via hole CTD1, a second via hole CTD2, and a third via hole CTS. The first electrode RME1 may be in contact with the conductive pattern layer CDP1 and the first voltage line VL1 through the first via hole CTD1 passing through the third bank pattern layer BP3, the via layer VIA and the passivation layer PV, and the second via hole CTD2 passing through the via layer VIA and the passivation layer PV. The first via hole CTD1 may connect the first electrode RME1 to the conductive pattern layer CDP1 so that the first power voltage of the first transistor T1 may be applied to the first electrode RME1 through the conductive pattern layer CDP1. The second via hole CTD2 may connect the first electrode RME1 to the first voltage line VL1 so that a signal for aligning the light emitting elements ED may be applied to the first electrode RME1 through the first voltage line VL1. The first electrode RME1 may be separated from the dam portion (or the partition portion) ROP after the light emitting element ED is aligned, so that the first electrode RME1 may not receive a signal from the first voltage line VL1, and may receive a signal from the first transistor T1 through the first via hole CTD1.

The second electrode RME2 and the third electrode RME3 may be in contact with the second voltage line VL2 through the third via hole CTS passing through the lower via layer VIA and the passivation layer PV below the second electrode RME2 and the third electrode RME3. The first electrode RME1 may be connected (e.g., electrically connected) to the first transistor T1 through the conductive pattern layer CDP1 so that the first power voltage may be applied to the first electrode RME1, and the second electrode RME2 and the third electrode RME3 may be connected (e.g., electrically connected) to the second voltage line VL2 so that the second power voltage may be applied to the second electrode RME2 and the third electrode RME3.

The first electrodes RME disposed in different subpixels SPXn adjacent to each other in the second direction DR2 or in an opposite direction of the second direction DR2 may be spaced apart from each other in the dam portion (or the partition portion) ROP of the sub-area SA. The arrangement of the first electrode RME1 may be formed by an electrode line extending in the second direction DR2 and then separated (or electrically or physically disconnected) in a subsequent process after the light emitting elements ED are disposed. The electrode line may be utilized to generate an electric field in the subpixel SPXn to align the light emitting element ED during the manufacturing process of the display device 10.

After the light emitting elements ED are aligned, the electrode line may be separated (or electrically or physically disconnected) from the dam portion (or the partition portion) ROP to form the electrodes RME spaced apart from each other in the second direction DR2. The process of separating the electrode lines may be performed after the process of forming the second insulating layer PAS2, and the second insulating layer PAS2 may not be disposed in the dam portion (or the partition portion) ROP. The second insulating layer PAS2 may be utilized as a mask pattern in the process of separating the electrode line.

The electrodes RME may be connected (e.g., electrically connected) to the light emitting element ED. Each of the electrodes RME may be connected to the light emitting element ED through the connection electrodes CNE (e.g., CNE1, CNE2 and CNE3) that will be described below, and may transfer the electrical signal applied from the conductive layer below the electrodes RME to the light emitting element ED.

The electrodes RME may include a conductive material having high reflectance. For example, the electrodes RME may include a metal such as silver (Ag), copper (Cu) and aluminum (Al) or an alloy containing aluminum (Al), nickel (Ni), lanthanum (La), etc. The electrodes RME may reflect light transmitting to the sides of the bank pattern layers BP1 and BP2 after being emitted from the light emitting element ED in an upper direction of each subpixel SPXn (e.g., in the third direction DR3).

For example, each of the electrodes RME may further include a transparent conductive material. For example, each electrode RME may include a material such as ITO, IZO and ITZO. In some embodiments, each of the electrodes RME may have a structure in which one or more layers of a transparent conductive material and a metal layer having high reflectance are stacked, or may be formed as a single layer including the transparent conductive material and the metal layer. For example, each electrode RME may have a stacked structure such as ITO/Ag/ITO/, ITO/Ag/IZO or ITO/Ag/ITZO/IZO.

The first insulating layer PAS1 may be disposed on the via layer VIA, the bank pattern layers BP and the electrodes RME. The first insulating layer PAS1 may be on the via layer VIA to cover the electrodes RME and the bank pattern layers BP. Also, the first insulating layer PAS1 may not be disposed in the dam portion (or the partition portion) ROP of the sub-area SA. The first insulating layer PAS1 may protect the electrodes RME and may mutually insulate different electrodes RME. Also, the first insulating layer PAS1 may prevent the light emitting element ED disposed on the first insulating layer PAS1 from being damaged due to direct contact with other members. In an embodiment, the first insulating layer PAS1 may be stepped such that the upper surface of the first insulating layer PAS1 may be partially recessed between electrodes RME spaced apart from each other in the first direction DR1. The light emitting elements ED may be disposed on the upper surface of the first insulating layer PAS1 that is stepped, and a space may be formed between the light emitting elements ED and the first insulating layer PAS1. The space may be filled with the second insulating layer PAS2 that will be described below.

The first insulating layer PAS1 may include contact portions CT1 and CT2 that expose a portion of the upper surface of the respective electrodes RME. The contact portions CT1 and CT2 may pass through the first insulating layer PAS1, and may be in contact with each of the electrodes RME exposed through the contact portions CT1 and CT2 of the first connection electrode CNE1 and the second connection electrode CNE2, which will be described below.

The bank layer BNL may be disposed on the first insulating layer PAS1. The bank layer BNL may be disposed in a ladder pattern by including a portion extending in the first direction DR1 and the second direction DR2 on a plan view, and may be disposed over a boundary area of the respective subpixels SPXn to define or distinguish the subpixels SPXn adjacent to each other. For example, the bank layer BNL may surround the emission area EMA and the sub-area SA, and areas defined (or partitioned) and opened by the bank layer BNL may be the emission area EMA and the sub-area SA, respectively.

The bank layer BNL may have a height (e.g., a predetermined height), and in some embodiments, the upper surface of the bank layer BNL may be disposed at a positions higher than the upper surface of the bank pattern layer BP. The thickness of the bank layer BNL may be equal to or greater than that of the bank pattern layer BP. The bank layer BNL may prevent ink from overflowing to the subpixel SPXn, which are adjacent to each other, in the second direction DR2 in an inkjet printing process of the manufacturing process of the display device 10. The bank layer BNL and the bank pattern layers BP1 and BP2 may include polyimide, but embodiments are not limited thereto.

The light emitting elements ED may be disposed on the first insulating layer PAS1. The light emitting element ED may include layers disposed in a direction parallel with the upper surface of the substrate SUB. The light emitting element ED of the display device 10 may be disposed such that an extended direction is parallel with the substrate SUB, and semiconductor layers included in the light emitting element ED may be sequentially disposed along the direction parallel with the upper surface of the substrate SUB, but embodiments are not limited thereto. In case that the light emitting element ED has another structure, the semiconductor layers may be disposed in a direction perpendicular to the substrate SUB.

The light emitting elements ED may be disposed between the first bank pattern layers BP1 and the second bank pattern layers BP2, or on the different electrodes RME. A portion of the light emitting elements ED may be disposed between the first bank pattern layer BP1 and the second bank pattern layer BP2, and another portion of the light emitting elements ED may be disposed between the first bank pattern layer BP1 and the second bank pattern layer BP2. According to an embodiment, the light emitting element ED may include a first light emitting element ED1 disposed between the first bank pattern layer BP1, which is disposed at the right side of the emission area EMA, and the second bank pattern layer BP2, and a second light emitting element ED2 disposed between the first bank pattern layer BP1, which is disposed at the left side of the emission area EMA, and the second bank pattern layer BP2.

The first light emitting element ED1 may be disposed on the first electrode RME1 and the third electrode RME3, and the second light emitting element ED2 may be disposed on the first electrode RME1 and the second electrode RME2. The first light emitting element ED1 may be adjacent to the right side in the emission area EMA of the corresponding subpixel SPXn, and the second light emitting element ED2 may be adjacent to the left side in the emission area EMA of the corresponding subpixel SPXn. The respective light emitting elements ED may not be defined or distinguished according to their positions in the emission area EMA but be defined or distinguished according to a connection relation with the connection electrode CNE that will be described below. The respective light emitting elements ED may have their respective connection electrodes CNE, with which both end portions (or opposite end portions) of the respective light emitting elements ED are in contact, according to the arrangement structure of the connection electrodes CNE, and may be defined or distinguished from each other according to the types of the connection electrodes CNE with which the both end portions (or opposite end portions) of the respective light emitting elements ED are in contact.

The light emitting elements ED may be connected (e.g., electrically connected) to the connection electrodes CNE1, CNE2 and CNE2 in contact with the connection electrodes CNE1, CNE2 and CNE3. Since a portion of the semiconductor layer is exposed on the extended one-way end surface of the light emitting elements ED, the exposed semiconductor layer may be in contact with the connection electrodes CNEs. The first connection electrode CNE1 may be in contact with an end portion of the first light emitting element ED1, and a portion (e.g., (3-1)-th extension portion CN_E1) of the third connection electrode CNE3 may be in contact with the other end portion of the first light emitting element ED1. The second connection electrode CNE2 may be in contact with an end portion of the second light emitting element ED2, and another portion (e.g., (3-2)-th extension portion CN_E2) of the third connection electrode CNE3 may be in contact with the other end portion of the second light emitting element ED2. Each of the light emitting elements ED may be connected (e.g., electrically connected) to the conductive layers below the electrode RME and the via layer VIA through the connection electrodes CNEs, and may emit light having a specific wavelength band as an electrical signal is applied thereto.

The second insulating layer PAS2 may be disposed on the light emitting elements ED and the first insulating layer PAS1. The second insulating layer PAS2 may include a pattern portion extending in the second direction DR2 between the bank pattern layers BP1 and BP2 and disposed on the light emitting elements ED. The pattern portion may partially surround an outer surface of the light emitting element ED, and may not cover both sides (or both end portions) of the light emitting element ED. The pattern portion may form a linear or island-shaped pattern within each subpixel SPXn in a plan view. The pattern portion of the second insulating layer PAS2 may protect the light emitting elements ED and fix the light emitting elements ED in the manufacturing process of the display device 10.

For example, the second insulating layer PAS2 may fill a space between the light emitting element ED and the second insulating layer PAS2 below the light emitting element ED. For example, the second insulating layer PAS2 may be formed to cover (e.g., entirely cover) the light emitting elements ED and patterned to expose both end portions of the light emitting elements ED. A portion of the second insulating layer PAS2 may fill the space between the light emitting elements ED and the first insulating layer PAS1 below the light emitting elements ED.

For example, a portion of the second insulating layer PAS2 may be disposed above the bank layer BNL in the sub-area SA. The second insulating layer PAS2 may include contact portions CT1 and CT2 disposed in the sub-area SA. The second insulating layer PAS2 may include a first contact portion CT1 overlapping the first electrode RME1, and a second contact portion CT2 overlapping the second electrode RME2. The contact portions CT1 and CT2 may pass through the second insulating layer PAS2 in addition to the first insulating layer PAS1. Each of the first contact portion CT1 and the second contact portion CT2 may expose a portion of the upper surface of the first electrode RME1 or the second electrode RME2 below the first contact portion CT1 and the second contact portion CT2.

The connection electrodes CNE (e.g., CNE1, CNE2 and CNE3) may include first and second connection electrodes CNE1 and CNE2 that are first type connection electrodes and a third connection electrode CNE3 that is a second type connection electrode.

The first connection electrode CNE1 may have a shape extending in the second direction DR2, and may be disposed on the first electrode RME1. A portion of the first connection electrode CNE1, which is disposed on the second bank pattern layer BP2, may overlap the first electrode RME1, and may extend from the first electrode RME1 in the second direction DR2 and extend to the sub-area SA positioned above the emission area EMA beyond the bank layer BNL. The first connection electrode CNE1 may overlap the third bank pattern layer BP3 positioned above the emission area EMA and may extend to cross over the third bank pattern layer BP3. The first connection electrode CNE1 may be connected (e.g., electrically connected) to at least one of the first electrode RME1 or the conductive pattern layer CDP1 through the first contact portion CT1 in the sub-area SA.

The second connection electrode CNE2 may have a shape extending in the second direction DR2, and may be disposed on the second electrode RME2. A portion of the second connection electrode CNE2, which is disposed on the first bank pattern layer BP1, may overlap the second electrode RME2, and may extend from the second electrode RME2 in the second direction DR2 and extend to the sub-area SA positioned above the emission area EMA beyond the bank layer BNL. The second connection electrode CNE2 may be in contact with the second voltage line VL2 in the sub-area SA through the second contact portion CT2. The first connection electrode CNE1 may be adjacent to the second connection electrode CNE2 with the third connection electrode CNE3 interposed therebetween. The first connection electrode CNE1 and the second connection electrode CNE2 may be disposed in parallel with each other, and may extend over the emission area EMA and the sub-area SA.

The third connection electrode CNE3 may overlap the first electrode RME1 and the third electrode RME3. For example, the third connection electrode CNE3 may include third extension portions CN_E1 and CN_E2 extending in the second direction, and a first connection portion CN_B1 connecting the third extension portions CN_E1 and CN_E2. The third extension portions may include a (3-1)-th extension portion CN_E1 and a (3-2)-th extension portion CN_E2. The (3-1)-th extension portion CN_E1 may be disposed on the third electrode RME3 in the emission area EMA, and the (3-2)-th extension portion CN_E2 may be disposed on the first electrode RME1 in the emission area EMA. The first connection portion CN_B1 may extend in the first direction DR1 on the bank layer BNL disposed below the emission area EMA to connect the (3-1)-th extension portion CN_E1 with the (3-2)-th extension portion CN_E2. The third connection electrode CNE3 may be disposed on the emission area EMA and the bank layer BNL, and may not be connected to the third electrode REM3. The first connection portion CN_B1 of the third connection electrode CNE3 may overlap a bank guide of the bank layer BNL. The third connection electrode CNE3 may transfer the signals applied through the light emitting elements ED. The first light emitting element ED1 and the second light emitting element ED2 may be connected to each other in series through the third connection electrode CNE3.

The third insulating layer PAS3 may be disposed on the third connection electrode CNE3, the first insulating layer PAS1 and the second insulating layer PAS2. The third insulating layer PAS3 may cover the third connection electrode CNE3 and may insulate the third connection electrode CNE3 from the first connection electrode CNE1 and the second connection electrode CNE2, which are adjacent to the third connection electrode CNE3. The first connection electrode CNE1 and the second connection electrode CNE2 may be disposed on the third insulating layer PAS3.

For example, an insulating layer may be further disposed on the third insulating layer PAS3, the first connection electrode CNE1 and the second connection electrode CNE2. The insulating layer may function to protect the members disposed on the substrate SUB from an external condition. The first insulating layer PAS1, the second insulating layer PAS2 and the third insulating layer PAS3 may include an inorganic insulating material or an organic insulating material.

Figure 10:
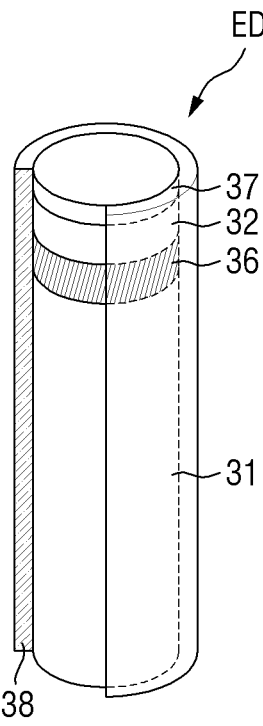
FIG. 10 is a schematic perspective view illustrating a light emitting element according to an embodiment.

FIG. 10 is a schematic perspective view illustrating a light emitting element according to an embodiment.

Referring to FIG. 10, the light emitting element ED may be a light emitting diode. For example, the light emitting element ED may be an inorganic light emitting diode made of an inorganic material with a size of a nano-meter to a micro-meter. The light emitting element ED may be aligned between two electrodes having different polarities in case that an electric field is formed in a specific direction between the two electrodes facing each other.

The light emitting element ED according to an embodiment may have a shape extending in a direction. The light emitting element ED may have a cylindrical shape, a rod shape, a wire shape or a tube shape, but embodiments are not limited thereto. The light emitting element ED may have a polygonal pillar shape such as a cube, a cuboid, and a hexagonal pillar, or may have various shapes such as a shape extending in a direction, having an external surface that is partially inclined.

The light emitting element ED may include a semiconductor layer doped with any conductivity type (e.g., p-type or n-type) impurities. The semiconductor layer may emit light of a specific wavelength band by an electrical signal applied from an outer power source. The light emitting element ED may include a first semiconductor layer 31, a second semiconductor layer 32, a light emitting layer 36, an electrode layer 37 and an insulating layer 38.

The first semiconductor layer 31 may be an n-type semiconductor. The first semiconductor layer 31 may include a semiconductor material having a formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of AlGaInN, GaN, AlGaN, InGaN, AlN and InN, which are doped with n-type dopants. The n-type dopants doped in the first semiconductor layer 31 may be Si, Ge, Sn, etc.

The second semiconductor layer 32 may be disposed on the first semiconductor layer 31 with the light emitting layer 36 interposed therebetween. The second semiconductor layer 32 may be a p-type semiconductor, and may include a semiconductor material having a chemical formula of $Al_xGa_yIn_{1-x-y}N$ ($0 \leq x \leq 1$, $0 \leq y \leq 1$, $0 \leq x \leq y \leq 1$). For example, the second semiconductor layer 32 may be any one or more of AlGaInN, GaN, AlGaN, InGaN, AlN and InN, which are doped with p-type dopants. The p-type dopants doped in the second semiconductor layer 32 may be Mg, Zn, Ca, Se, Ba, etc.

The first semiconductor layer 31 and the second semiconductor layer 32 are shown as being formed of a single layer, but embodiments are not limited thereto. The first semiconductor layer 31 and the second semiconductor layer 32 may further include a larger number of layers, such as a clad layer or a tensile strain barrier reducing (TSBR) layer according to the material of the light emitting layer 36.

The light emitting layer 36 may be disposed between the first semiconductor layer 31 and the second semiconductor layer 32. The light emitting layer 36 may include a single or multiple quantum well structure material. In case that the light emitting layer 36 includes a material of a multiple quantum well structure, quantum layers and well layers may be alternately stacked. The light emitting layer 36 may emit light by combination of electron-hole pairs in accordance with electrical signals applied through the first semiconductor layer 31 and the second semiconductor layer 32. The light emitting layer 36 may include a material such as AlGaN and AlGaInN. In case that the light emitting layer 36 has a stacked structure of quantum layers and well layers, which are alternately stacked, as a multiple quantum well structure, the quantum layer may include a material such as AlGaN or AlGaInN, and the well layer may include a material such as GaN or AlInN.

The light emitting layer 36 may have a structure in which a semiconductor material having a big band gap energy and semiconductor materials having a small band gap energy are alternately stacked, and may include group-III or group-V semiconductor materials according to a wavelength band of light that is emitted. The light emitting layer 36 may emit light of a blue wavelength band. In another example, the light emitting layer 36 may emit light of a red or green wavelength band.

The electrode layer 37 may be an ohmic connection electrode, but embodiments are not limited thereto. The electrode layer 37 may be a Schottky connection electrode. The light emitting element ED may include at least one electrode layer 37. The light emitting element ED may include one or more electrode layers 37, but embodiments are not limited thereto. In another example, the electrode layer 37 may be omitted.

The electrode layer 37 may reduce resistance between the light emitting element ED and an electrode or a connection electrode in case that the light emitting element ED is connected (e.g., electrically connected) to the electrode or the connection electrode in the display device 10. The electrode layer 37 may include a metal having conductivity. For example, the electrode layer 37 may include at least one of Al, Ti, In, Au, Ag, ITO, IZO or ITZO.

The insulating layer 38 may surround outer surfaces of the semiconductor layers and the electrode layer. For example, the insulating layer 38 may surround an outer surface of the light emitting layer 36, and may be formed to expose both end portions in a length direction of the light emitting element ED. Also, the insulating layer 38 may have a rounded upper surface on a section in an area adjacent to at least an end portion of the light emitting element ED.

The insulating layer 38 may include materials having insulation property, for example, silicon oxide ($SiO_x$), silicon nitride ($SiN_x$), silicon oxynitride ($SiO_xN_y$), aluminum nitride ($AlN_x$), aluminum oxide ($Al_xO_y$), etc. The insulating layer 38 is illustrated as being formed of a single layer, but embodiments are not limited thereto. In some embodiments, the insulating layer 38 may be formed of a multi-layered structure in which multiple layers are stacked.

The insulating layer 38 may function to protect the above members. The insulating layer 38 may prevent an electrical short circuit that may occur in the light emitting layer 36 in case that the light emitting element ED is in contact with (e.g., in directly contact with) the electrode to which the electrical signal is transferred. For example, the insulating layer 38 may prevent light emitting efficiency of the light emitting element ED from being deteriorated or degraded.

Also, an outer surface of the insulating layer 38 may be surface-treated. The light emitting element ED may be aligned by being sprayed or injected onto the electrode in a state that it is dispersed in an ink (e.g., a predetermined ink). The surface of the insulating layer 38 may be hydrophobic-treated or hydrophilic-treated, so that the light emitting element ED may be maintained to be dispersed in the ink without being condensed with another light emitting element ED adjacent thereto.

Hereinafter, other embodiments of the display device 10 will be described with reference to other drawings.

Figure 11:
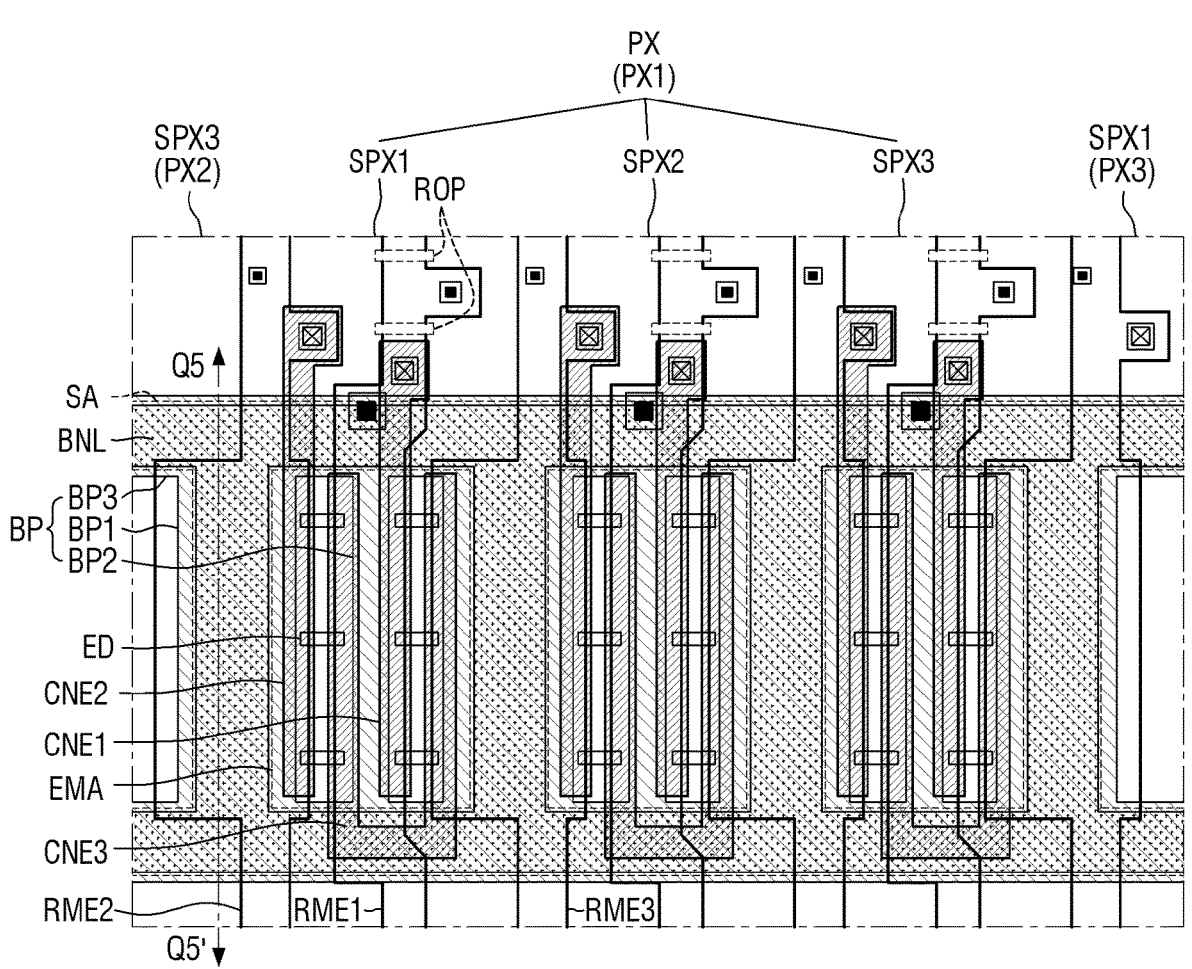
FIG. 11 is a schematic plan view illustrating a pixel of a display device according to an embodiment.
Figure 11:
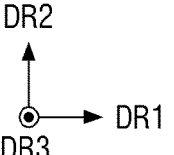
Figure 12:
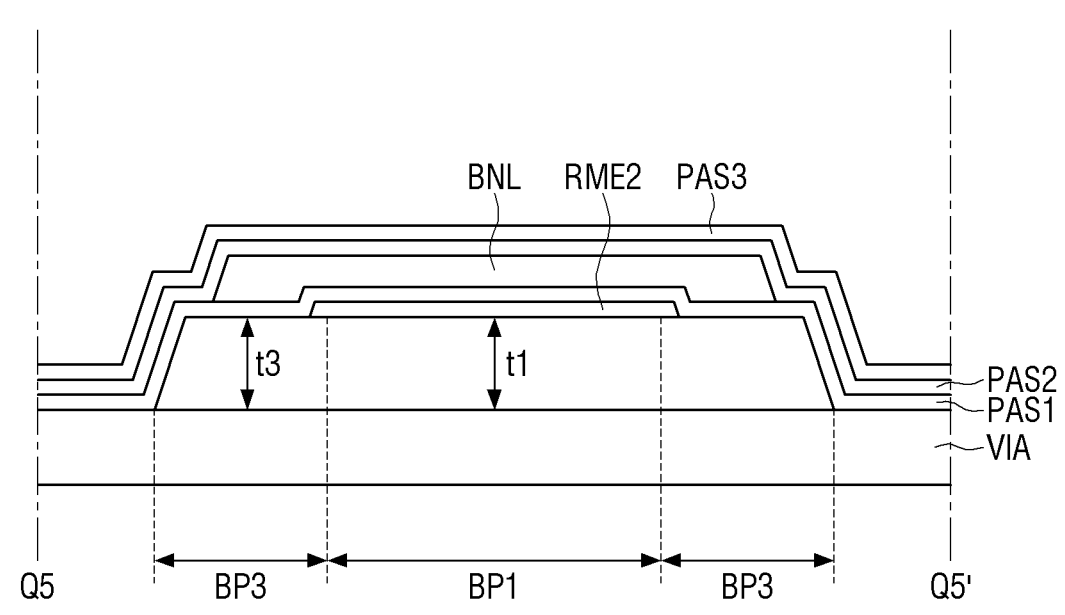
FIG. 12 is a schematic cross-sectional view taken along line Q5-Q5' of FIG. 11.
Figure 12:
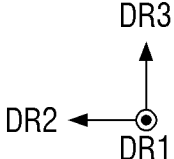

FIG. 11 is a schematic plan view illustrating a pixel of a display device according to an embodiment. FIG. 12 is a schematic cross-sectional view taken along line Q5-Q5' of FIG. 11.

The embodiment of FIGS. 11 and 12 is different from the above-described embodiment in that the thickness t1 of the first bank pattern layer BP1 disposed between the first subpixel SPX1 and the third subpixel SPX3 adjacent to the first subpixel SPX1 is greater than the thickness t1 of the first bank pattern layer BP1 disposed between the first subpixel SPX1 and the second subpixel SPX2 adjacent to the first subpixel SPX1. Hereinafter, the redundant description regarding the above-described embodiment will be omitted for descriptive convenience, and a difference from the above-described embodiment will be described.

The bank pattern layer BP may define or distinguish the subpixels SPXn together with the bank layer BNL. Each pixel PXn may include three subpixels SPXn, including a first subpixel SPX1, a second subpixel SPX2, and a third subpixel SPX3. The display device 10 may include pixels PXn that includes three subpixels SPXn. Referring to FIG. 11, the pixels PXn may include a first pixel PX1, a second pixel PX2, and a third pixels PX3. The first pixel PX1 may be disposed between the second pixel PX2 and the third pixels PX3 in the first direction DR1. For example, each of the first, second, and third pixels PX1, PX2, and PX3 may include the first subpixel SPX1, the second subpixel SPX2, and the third subpixel SPX3, which are sequentially arranged in the first direction DR1. In an embodiment, the thickness t1 of the first bank pattern layer BP1 disposed at the boundary area of each pixel PXn may be formed to be great, whereby the ink between the respective pixels may be prevented from overflowing.

In an embodiment, the thickness t1 of the first bank pattern layer BP1 disposed between adjacent pixels PX (e.g., the first and second pixels PX1 and PX2 or the first and third pixels PX1 and PX3) may be greater than the thickness t1 of the first bank pattern layers disposed between adjacent subpixels SPXn in a single pixel PX. For example, the thickness t1 of the first bank pattern layer BP1 disposed between the first subpixel SPX1 and the third subpixel SPX3 adjacent to the first subpixel SPX1 may be greater than the thickness t1 of the first bank pattern layer BP1 disposed between the first subpixel SPX1 and the second subpixel SPX2 adjacent to the first subpixel SPX1. For example, the thickness t1 of the first bank pattern layer BP1 disposed between the third subpixel SPX3 of the first pixel PX1 and the first subpixel SPX1 of the third pixel PX3 adjacent to the third subpixel SPX3 of the first pixel PX1 may be greater than the thickness t1 of the first bank pattern layer BP1 disposed between the second subpixel SPX2 of the first pixel PX1 and the third subpixel SPX3 of the first pixel PX1 adjacent to the second subpixel SPX2 of the first pixel PX1.

As shown in FIG. 11, the thickness t1 of the first bank pattern layer BP1 disposed at the left side of the first subpixel SPX1 may be greater than the thickness t1 of the first bank pattern layer BP1 disposed at the right side of the first subpixel SPX1 of the first pixel PX1. For example, the thickness t1 of the first bank pattern layer BP1 disposed at the right side of the third subpixel SPX3 of the first pixel PX1 may be greater than the thickness t2 of the second bank pattern layer BP2 disposed at the left side of the third subpixel SPX3 of the first pixel PX1. Also, as shown in FIG. 12, the thickness t1 of the first bank pattern layer BP1 disposed at the left side of the first subpixel SPX1 of the first pixel PX1 may be substantially equal to the thickness t3 of the third bank pattern layer BP3. Further, the thickness t1 of the first bank pattern layer BP1 disposed at the right side of the third subpixel SPX3 of the first pixel PX1 may be substantially equal to the thickness t3 of the third bank pattern layer BP3. In case that the thicknesses t1 and t3 of the first and third bank pattern layers BP1 and BP3 that define the boundary area of each pixel are substantially equal to each other, the ink may be prevented from overflowing to the adjacent pixel PXn.

In an embodiment, the height of the upper surface of the bank layer BNL that overlaps the first bank pattern layer BP1 disposed between the adjacent pixels PX may be greater than the height of the upper surface of the bank layer BNL that overlaps the first bank pattern layers BP1 disposed between adjacent subpixels SPXn in a single pixel PX. The thickness t2 of the second bank pattern layer BP2 may be substantially equal to the thickness T1 of the first bank pattern layers disposed between adjacent subpixels SPXn in a single pixel PX (See, e.g., FIG. 5). The thickness t3 of the third bank pattern layer BP3 may be substantially equal to the thickness t1 of the first bank pattern layer BP1 disposed between the adjacent pixels PX.

As described above, the third bank pattern layer BP3 may be disposed between the emission area EMA and the sub-area SA of each of the first subpixel SPX1, the second subpixel SPX2 and the third subpixel SPX3. The third bank pattern layer BP3 may be formed to have a greater thickness to increase the height of the upper surface of the bank layer BNL disposed thereon, thereby preventing the ink from overflowing to the sub-area SA. In an embodiment, the thickness t1 of the first bank pattern layer BP1 disposed between the first subpixel SPX1 of the first pixel PX1 and the third subpixel SPX3 of the second pixel PX2, which is adjacent to the first subpixel SPX1 of the first pixel PX1, and between the third subpixel SPX3 of the first pixel PX1 and the first subpixel SPX1 of the third pixel PX3, which is adjacent to the third subpixel SPX3 of the first pixel PX1, may be increased. Therefore, the height of the upper surface of the bank layer BNL that defines or distinguishes the pixel PX including the first subpixel SPX1, the second subpixel SPX2 and the third subpixel SPX3 may be increased, whereby the ink may be prevented from overflowing to the adjacent pixel PX.

Figure 13:
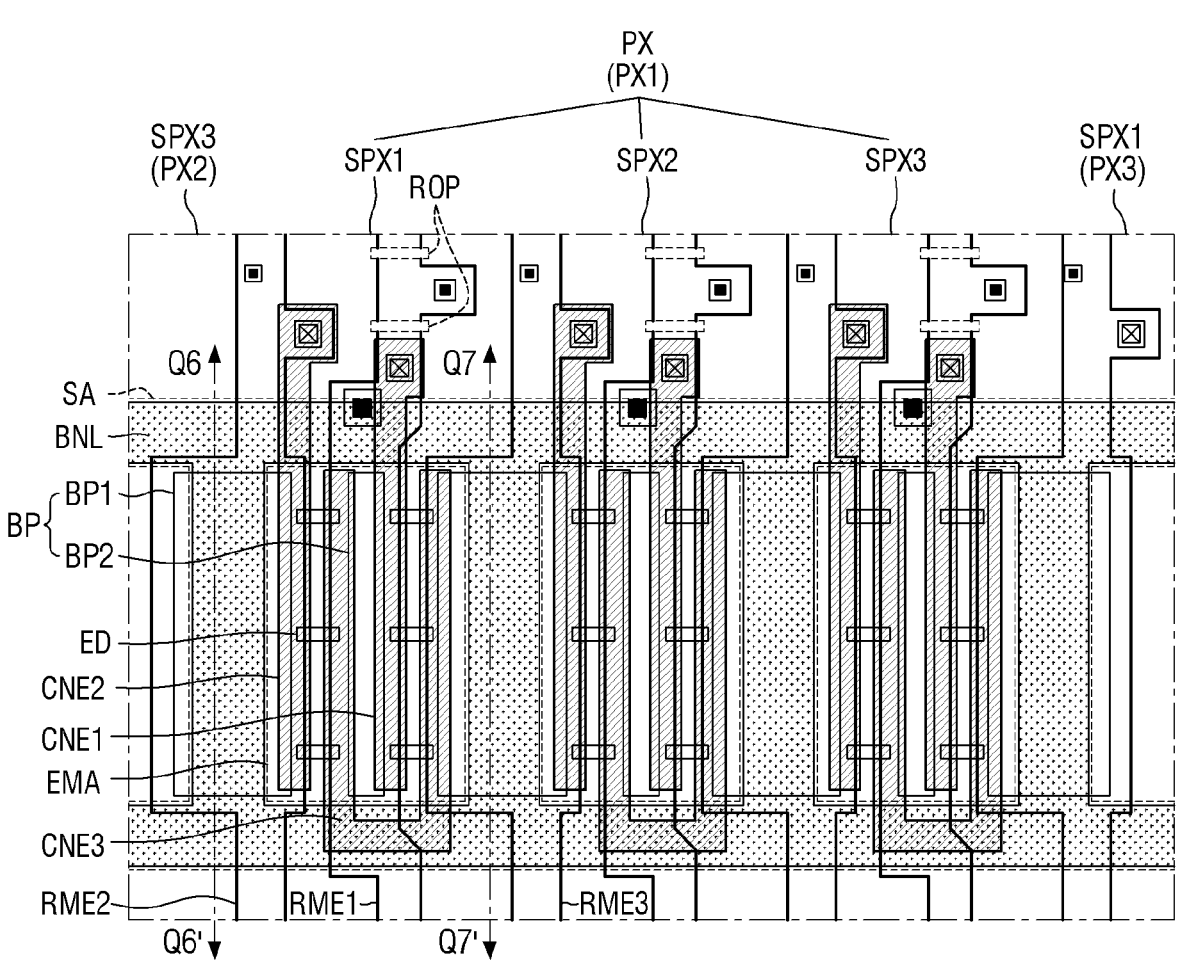
FIG. 13 is a schematic plan view illustrating a pixel of a display device according to an embodiment.
Figure 13:
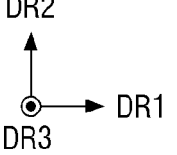
Figure 14:
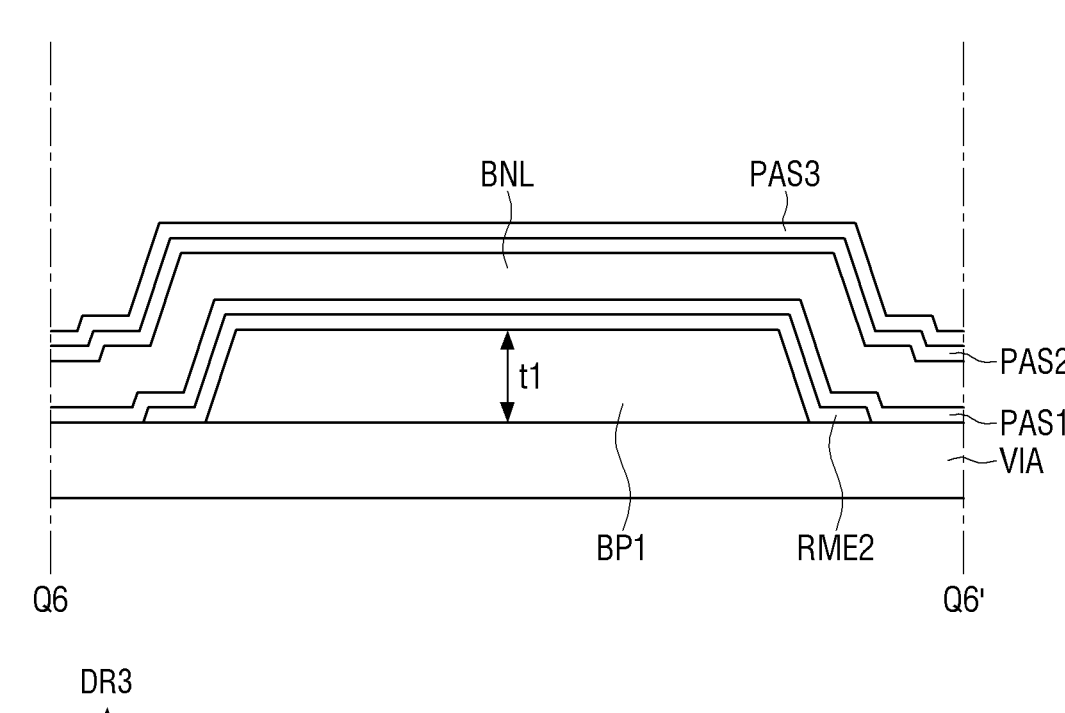
FIG. 14 is a schematic cross-sectional view taken along line Q6-Q6' of FIG. 13.
Figure 15:
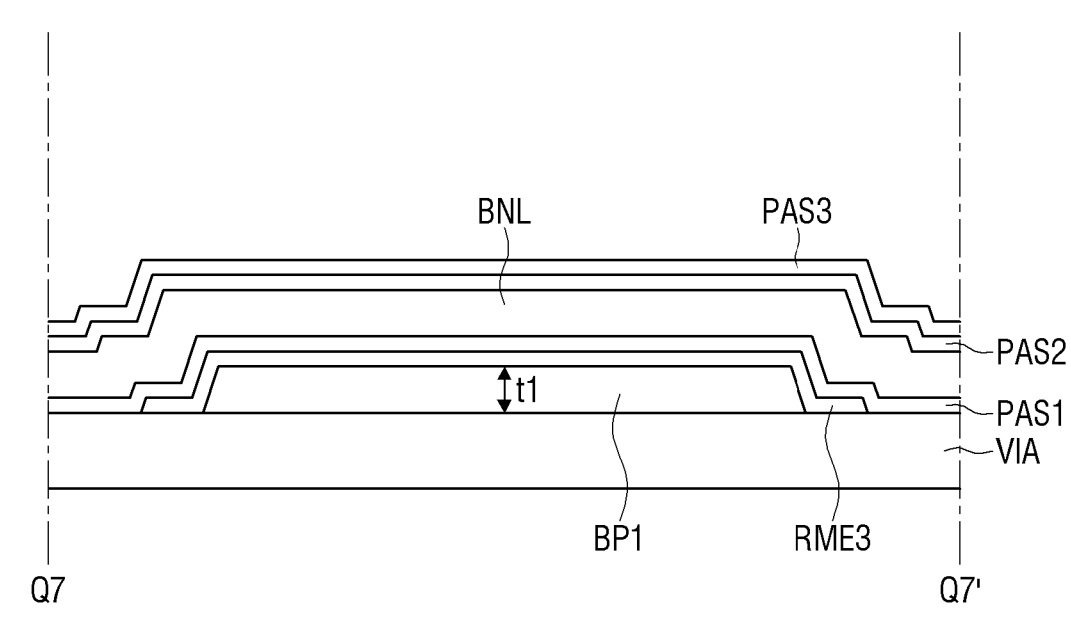
FIG. 15 is a schematic cross-sectional view taken along line Q7-Q7' of FIG. 13.
Figure 15:
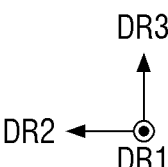

FIG. 13 is a schematic plan view illustrating a pixel of a display device according to an embodiment. FIG. 14 is a schematic cross-sectional view taken along line Q6-Q6' of FIG. 13. FIG. 15 is a schematic cross-sectional view taken along line Q7-Q7' of FIG. 13.

The embodiment of FIGS. 13 to 15 is different from the above-described embodiment in that the first and second bank pattern layers BP1 and BP2 of the island-shaped pattern are disposed and the third bank pattern layer BP3 is omitted. Hereinafter, the redundant description of the above-described embodiment will be omitted for descriptive convenience, and a difference from the above-described embodiment will be described.

The display device 10 may include pixels PXn that includes three subpixels SPXn. Referring to FIG. 13, the pixels PXn may include a first pixel PX1, a second pixel PX2, and a third pixels PX3. The first pixel PX1 may be disposed between the second pixel PX2 and the third pixels PX3 in the first direction DR1. For example, each of the first, second, and third pixels PX1, PX2, and PX3 may include the first subpixel SPX1, the second subpixel SPX2, and the third subpixel SPX3, which are sequentially arranged in the first direction DR1. The first bank pattern layers BP1 may be disposed over subpixels SPXn adjacent to each other in the first direction DR1. The first bank pattern layers BP1 may have a shape extending in the second direction DR2, and may be spaced apart from each other in the first direction DR1. The length of the first bank pattern layers BP1 extending in the second direction DR2 may be smaller than the length of the emission area EMA surrounded by the bank layer BNL in the second direction DR2. For example, the first bank pattern layers BP1 may be formed in a bar-shaped island pattern extending in the second direction DR2.

The second bank pattern layer BP2 may be disposed in the emission area EMA of the subpixel SPXn, and may have a shape extending in the second direction DR2. The second bank pattern layer BP2 may be disposed between the first bank pattern layers BP1, and may be spaced apart from the first bank pattern layers BP1. The second bank pattern layer BP2 may form in an island-shaped pattern that extends in the second direction DR2 and has a narrow width in the emission area EMA of each subpixel SPXn on the front surface of the display area DPA.

The first bank pattern layers BP1 and the second bank pattern layer BP2 have the same length in the second direction DR2. For example, the first bank pattern layers BP1 and the second bank pattern layer BP2 have different widths from each other in the first direction DR1. A portion of the bank layer BNL, which extends in the second direction DR2, may overlap the first bank pattern layers BP1 in the thickness direction (e.g., third direction DR3). The first and second bank pattern layers BP1 and BP2 may be disposed in an island-shaped pattern on the front surface of the display area DPA. The light emitting elements ED may be disposed between the first and second bank pattern layers BP1 and BP2 that are spaced apart from each other.

In an embodiment, the thickness t1 of the first bank pattern layer BP1 disposed between the adjacent pixels PX (e.g., the first and second pixels PX1 and PX2 or the first and third pixels PX1 and PX3) may be greater than the thickness t1 of the first bank pattern layers BP1 disposed between adjacent subpixels SPXn in a single pixel PX. The thickness t1 of the first bank pattern layer BP1 disposed between the first subpixel SPX1 of the first pixel PX1 and the third subpixel SPX3 of the first pixel PX1 adjacent to the first subpixel SPX1 of the first pixel PX1 may be greater than the thickness t1 of the first bank pattern layer BP1 disposed between the first subpixel SPX1 of the first pixel PX1 and the second subpixel SPX2 of the first pixel PX1 adjacent to the first subpixel SPX1 of the first pixel PX1. For example, in FIG. 13, the thickness t1 of the first bank pattern layer BP1 disposed at the left side of the first subpixel SPX1 of the first pixel PX1 may be greater than the thickness t1 of the first bank pattern layer BP1 disposed at the right side of the first subpixel SPX1 of the first pixel PX1. Referring to FIG. 13, the thickness t1 of the first bank pattern layer BP1 disposed at the right side of the third subpixel SPX3 of the first pixel PX1 may be greater than the thickness t2 of the second bank pattern layer BP2 disposed at the left side of the third subpixel SPX3 of the first pixel PX1.

In an embodiment of, the height of the upper surface of the bank layer BNL overlapping the first bank pattern layer BP1 disposed between the adjacent pixels PX may be greater than the height of the upper surface of the bank layer BNL overlapping the first bank pattern layers BP1 disposed between adjacent subpixels SPXn in a single pixel PX.

In an embodiment, the thickness t1 of the first bank pattern layer BP1 disposed between the first subpixel SPX1 of the first pixel PX1 and the third subpixel SPX3 of the second pixel PX2, which is adjacent to the first subpixel SPX1 of the first pixel PX1, and between the third subpixel SPX3 of the first pixel PX1 and the first subpixel SPX1 of the third pixel PX3, which is adjacent to the third subpixel SPX3 of the first pixel PX1, may be increased. For example, the thickness t1 of the first bank pattern layer BP1 disposed between the first subpixel SPX1 of the first pixel PX1 and the second subpixel SPX2 of the first pixel PX1 adjacent to the first subpixel SPX1 of the first pixel PX1 and between the second subpixel SPX2 of the first pixel PX1 and the third subpixel SPX3 of the first pixel PX1 adjacent to the second subpixel SPX2 of the first pixel PX1 may be relatively small. Therefore, the height of the upper surface of the bank layer BNL that defines or distinguishes the pixel PX including the first subpixel SPX1, the second subpixel SPX2 and the third subpixel SPX3 may be increased, whereby preventing the ink from overflowing to the adjacent pixel PX. Thus, the ink may readily spread in the same pixel PX to uniformly form the thickness of the ink.

In concluding the detailed description, those skilled in the art will appreciate that many variations and modifications can be made to the embodiments without substantially departing from the principles of the invention. Therefore, the embodiments of the invention are used in a generic and descriptive sense only and not for purposes of limitation.

What is claimed is:
1. A display device comprising:
a substrate including a plurality of subpixels;
a via layer disposed on the substrate;

first bank pattern layers, a second bank pattern layer, and third bank pattern layers disposed on the via layer, the first, second, and third bank pattern layers being at a same layer;

a first electrode disposed on the second bank pattern layer and a second electrode disposed on the first bank pattern layers, the first electrode and the second electrode being spaced apart from each other;

a light emitting element disposed between the first electrode and the second electrode; and a bank layer disposed on the first bank pattern layers and the third bank pattern layers, the bank layer defining an emission area, wherein the third bank pattern layers extend in a first direction and spaced apart from each other, the first bank pattern layers and the second bank pattern layer extend from the third bank pattern layers in a second direction intersecting the first direction, and a thickness of the first bank pattern layers is smaller than a thickness of the third bank pattern layers.

2. The display device of claim 1, wherein a height of an upper surface of the bank layer overlapping the third bank pattern layers is greater than a height of an upper surface of the bank layer overlapping the first bank pattern layers.

3. The display device of claim 1, wherein a width of the third bank pattern layers is greater than a width of the bank layer overlapping the third bank pattern layers.

4. The display device of claim 1, wherein a width of the first bank pattern layers is greater than a width of the bank layer overlapping the first bank pattern layers.

5. The display device of claim 1, wherein the first bank pattern layers, the second bank pattern layer and the third bank pattern layers are continuously connected to each other.

6. The display device of claim 1, wherein the second bank pattern layer overlaps the emission area, and is disposed between the first bank pattern layers spaced apart from each other in the first direction.

7. The display device of claim 1, wherein the bank layer defines a sub-area spaced apart from the emission area in the second direction, and the third bank pattern layers are disposed between the emission area and the sub-area.

8. The display device of claim 1, wherein the first bank pattern layers and the third bank pattern layers overlap the bank layer, and the second bank pattern layer does not overlap the bank layer.

9. The display device of claim 1, further comprising:

a first connection electrode that is in contact with a first end portion of the light emitting element, and a second connection electrode that is in contact with a second end portion of the light emitting element, wherein the first connection electrode overlaps the second bank pattern layer and extends to cross over the third bank pattern layers.

10. A display device comprising:

a substrate including a plurality of pixels, each of the plurality of pixels including a plurality of subpixels;

a via layer disposed on the substrate;

first bank pattern layers, a second bank pattern layer, and third bank pattern layers disposed on the via layer, the first, second, and third bank pattern layers being at a same layer, and a thickness of the first bank pattern layers being smaller than a thickness of the third bank pattern layers;

a first electrode disposed on the second bank pattern layer and a second electrode disposed on the first bank pattern layers, the first electrode and the second electrode spaced apart from each other;

a light emitting element disposed between the first electrode and the second electrode; and a bank layer disposed on the first bank pattern layers and the third bank pattern layers, the bank layer defining an emission area, wherein the third bank pattern layers extend in a first direction and spaced apart from each other, the first bank pattern layers and the second bank pattern layer extend from the third bank pattern layers in a second direction intersecting the first direction, and a thickness of the first bank pattern layers disposed between the pixels adjacent to each other is greater than a thickness of the first bank pattern layers disposed between the subpixels adjacent to each other in each of the pixels.

11. The display device of claim 10, wherein the plurality of pixels include a first pixel, a second pixel, and a third pixel, the first pixel disposed between the second pixel and the third pixel, each of the first pixel, the second pixel, and the third pixel includes a first subpixel, a second subpixel adjacent to the first subpixel, and a third subpixel adjacent to the second subpixel, and a thickness of a first bank pattern layer of the first bank pattern layers disposed between the first subpixel of the first pixel and the third subpixel of the second pixel, which is adjacent to the first subpixel of the first pixel, is greater than a thickness of the first bank pattern layer disposed between the first subpixel of the first pixel and the second subpixel of the first pixel.

12. The display device of claim 11, wherein a thickness of the first bank pattern layer disposed between the third subpixel of the first pixel and the first subpixel of the third pixel adjacent to the third subpixel of the first pixel is greater than a thickness of the first bank pattern layer disposed between the second subpixel of the first pixel and the third subpixel of the first pixel.

13. The display device of claim 10, wherein a height of an upper surface of the bank layer disposed between the pixels adjacent to each other is greater than a height of an upper surface of the bank layer disposed between the subpixels adjacent to each other in each of the pixels.

14. The display device of claim 10, wherein a thickness of the third bank pattern layers is substantially equal to a thickness of the first bank pattern layers disposed between the pixels adjacent to each other.

15. The display device of claim 10, wherein a thickness of the second bank pattern layer is substantially equal to a thickness of the first bank pattern layers disposed between the subpixels adjacent to each other.

16. An electronic device comprising:

a substrate including a plurality of pixels, each of the plurality of pixels including a plurality of subpixels;

a via layer disposed on the substrate;

first bank pattern layers, a second bank pattern layer, and third bank pattern layers disposed on the via layer and positioned at a same layer as one another, the first and second bank pattern layers being spaced apart from each other, and a thickness of the first bank pattern layers being smaller than a thickness of the third bank pattern layers;

a first electrode disposed on the second bank pattern layer and a second electrode disposed on the first bank pattern layers, the first electrode and the second electrode spaced apart from each other;

a light emitting element disposed between the first electrode and the second electrode; and a bank layer disposed on the first bank pattern layers, the bank layer defining an emission area, wherein the second bank pattern layer overlaps the emission area, and is disposed between the first bank pattern layers are spaced apart from each other, and a thickness of the first bank pattern layers disposed between the pixels adjacent to each other is greater than a thickness of the first bank pattern layers disposed between the subpixels adjacent to each other in each of the plurality of pixels.

17. The electronic device of claim 16, wherein the bank layer includes a first portion extending in a first direction and a second portion extending in a second direction intersecting the first direction, and the first bank pattern layers and the second bank pattern layer extend in the second direction and spaced apart from each other in the first direction.

18. The electronic device of claim 16, wherein the plurality of pixels include a first pixel, a second pixel, and a third pixel, the first pixel disposed between the second pixel and the third pixel, each of the first pixel, the second pixel, and the third pixel includes a first subpixel, a second subpixel adjacent to the first subpixel, and a third subpixel adjacent to the second subpixel, and a thickness of a first bank pattern layer of the first bank pattern layers disposed between the first subpixel of the first pixel and the third subpixel of the second pixel is greater than a thickness of the first bank pattern layer disposed between the first subpixel of the first pixel and the second subpixel of the first pixel.

19. The electronic device of claim 18, wherein a thickness of the first bank pattern layer disposed between the third subpixel of the first pixel and the first subpixel of the third pixel adjacent to the third subpixel of the first pixel is greater than a thickness of the first bank pattern layer disposed between the second subpixel of the first pixel and the third subpixel of the first pixel.

20. The electronic device of claim 16, wherein a height of an upper surface of the bank layer disposed between the pixels adjacent to each other is greater than a height of an upper surface of the bank layer disposed between the subpixels adjacent to each other in each of the pixels.

* * * * *